United States Patent
Lee et al.

(10) Patent No.: US 12,471,467 B2
(45) Date of Patent: Nov. 11, 2025

(54) DISPLAY DEVICE AND ELECTRONIC DEVICE HAVING THE SAME

(71) Applicant: Samsung Display Co., Ltd., Yongin-Si (KR)

(72) Inventors: Cheol Gon Lee, Yongin-si (KR); So Il Yoon, Yongin-si (KR); Kyung Hoe Lee, Yongin-si (KR); Mu Kyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/788,141

(22) Filed: Jul. 30, 2024

(65) Prior Publication Data
US 2025/0048866 A1  Feb. 6, 2025

(30) Foreign Application Priority Data
Aug. 1, 2023 (KR) .................. 10-2023-0100691

(51) Int. Cl.
*H10K 59/131* (2023.01)
*H10K 59/126* (2023.01)
*H10K 59/65* (2023.01)
*H10K 59/88* (2023.01)
*G06V 40/13* (2022.01)

(52) U.S. Cl.
CPC ......... *H10K 59/131* (2023.02); *H10K 59/126* (2023.02); *H10K 59/65* (2023.02); *H10K 59/88* (2023.02); *G06V 40/1318* (2022.01)

(58) Field of Classification Search
CPC ..... H10K 59/131; H10K 59/35; H10D 86/441
See application file for complete search history.

(56) References Cited

U.S. PATENT DOCUMENTS

| | | | |
|---|---|---|---|
| 10,644,091 B2 | 5/2020 | Liu et al. | |
| 2010/0295764 A1* | 11/2010 | Wang | G02F 1/136286 345/92 |
| 2018/0239476 A1* | 8/2018 | Yoshida | G06F 3/0443 |
| 2022/0165834 A1* | 5/2022 | Jo | H10K 59/60 |
| 2022/0173197 A1 | 6/2022 | Bang et al. | |
| 2023/0116805 A1 | 4/2023 | Kim et al. | |
| 2024/0349559 A1 | 10/2024 | Chen | |

FOREIGN PATENT DOCUMENTS

| | | |
|---|---|---|
| CN | 108493226 A | 9/2018 |
| CN | 116322187 A | 6/2023 |
| EP | 3792979 A1 | 3/2021 |
| KR | 10-2022-0077323 A | 6/2022 |

* cited by examiner

*Primary Examiner* — Yuzhen Shen
(74) *Attorney, Agent, or Firm* — Innovation Counsel LLP

(57) ABSTRACT

A display device may include: a substrate including a display area which includes a first area and a second area and a non-display area; data lines located in the first area and the second area; readout lines located in the first area and the second area, the readout lines being spaced apart from the data lines; connection lines extending from the first area to the second area, the connection lines being electrically connected to corresponding readout lines disposed in the second area; and bridge lines extending from the second area to the first area, the bridge lines being electrically connected to corresponding data lines disposed in the first area. The connection lines and the bridge lines does not overlap with each other.

19 Claims, 22 Drawing Sheets

LED: AE, EML, CE
LRD: EL1, OPL, EL2
C1: BML1, BML2
C2: GE1, GE2, LE
C3: UE
C4: TE1, TE2, TE3, TE4
C5: ACL
C6: BRP1, BRP2

DISPLAY DEVICE AND ELECTRONIC DEVICE HAVING THE SAME

CROSS-REFERENCE TO RELATED APPLICATION

The present application claims priority under 35 U.S.C. § 119 (a) to Korean patent application No. 10-2023-0100691 filed on Aug. 1, 2023, in the Korean Intellectual Property Office, the entire disclosure of which is incorporated herein by reference.

BACKGROUND

1. Technical Field

The present disclosure generally relates to a display device and an electronic device having the same.

2. Related Art

Recently, as interest in information displays is increased, research and development of display devices have been continuously conducted.

SUMMARY

Embodiments provide a display device with improved reliability and an electronic device having the same.

According to an embodiment of disclosure, a display device may include: a substrate including a display area which includes a first area and a second area, and a non-display area; a plurality of data lines located in the first area and the second area; a plurality of readout lines located in the first area and the second area, the plurality of readout lines being spaced apart from the plurality of data lines, respectively; a plurality of connection lines extending from the first area to the second area, the plurality of connection lines being electrically connected to corresponding readout lines disposed in the second area; and a plurality of bridge lines extending from the second area to the first area, the plurality of bridge lines being electrically connected to corresponding data lines disposed in the first area. The plurality of connection lines and the plurality of bridge lines do not overlap with each other.

The display device may further include: a plurality of first lines located in a fan-out area which is disposed in the non-display area, the plurality of first lines being electrically connected to the plurality of connection lines, respectively; a plurality of second lines located in the fan-out area, the plurality of second lines being electrically connected to the plurality of bridge lines, respectively; and a pad part located in a pad area which is disposed in the non-display area. The pad part may include a first pad part including a plurality of first pads electrically connected to the plurality of first lines, respectively, and a second pad part including a plurality of second pads electrically connected to the plurality of second lines, respectively. The plurality of first lines may be disposed at both sides of the second line, and the first pad part may be disposed at both sides of the plurality of second lines, and the first pad part is disposed at both sides of the second pad part.

The display device may further include: a first line located in a fan-out area of the non-display area, the first line being electrically connected to the connection line; a second line located in the fan-out area, the second line being electrically connected to the bridge line; and a pad part located in a pad area of the non-display area. The pad part may include a first pad part electrically connected to the first line and a second pad part electrically connected to the second line. The second line may be disposed at both sides of the first line, and the second pad part may be disposed at both sides of the first pad part.

The connection line may include a horizontal connection line extending from the first area to the second area along a first direction and a vertical connection line which is located in the first area and extends in a second direction intersecting the first direction. The bridge line may include a horizontal bridge line extending from the second area to the first area along the first direction and a vertical bridge line which is located in the second area and extends in the second direction.

The vertical connection line, the vertical bridge line, the data line, and the readout line may be disposed in the same layer.

The data line disposed in the first area may be electrically connected to the vertical bridge line through the horizontal bridge line. The readout line disposed in the second area may be electrically connected to the vertical connection line through the horizontal connection line.

An insulating layer may be disposed between one end of the horizontal bridge line and the vertical bridge line and between the other end of the horizontal bridge line and the data line. The insulating layer may be disposed between one end of the horizontal connection line and the vertical connection line and between the other end of the horizontal connection line and the readout line.

The one end of the horizontal bridge line may be electrically connected to the vertical bridge line through a first contact hole formed through the insulating layer, and the other end of the horizontal bridge line may be electrically connected to the data line through a second contact hole formed through the insulating layer. The one end of the horizontal connection line may be electrically connected to the vertical connection line through a third contact hole formed through the insulating layer, and the other end of the horizontal connection line may be electrically connected to the readout line through a fourth contact hole formed through the insulating layer.

The plurality of readout lines disposed in the first area may be directly connected to corresponding first pads. The plurality of data lines disposed in the second area may be directly connected to corresponding second pads.

In the first area, the plurality of vertical connection lines, the plurality of readout lines, and the plurality of data lines may be disposed to be spaced apart from each other. In the second area, the plurality of vertical bridge lines, the plurality of readout lines, and the plurality of data lines may be disposed to be spaced apart from each other. The plurality of horizontal connection lines and the plurality of horizontal bridge lines may be disposed to be spaced apart from each other.

The plurality of horizontal connection lines may be disposed in different layers. The plurality of horizontal bridge lines and the plurality of vertical bridge lines may be disposed in different layers.

The plurality of horizontal connection lines and the plurality of horizontal bridge lines may be disposed in the same layer. The v the plurality of vertical connection lines and the plurality of vertical bridge lines may be disposed in the same layer.

The plurality of horizontal connection lines and the plurality of horizontal bridge lines may be disposed in different layers.

The display device may further include a dummy line disposed between the plurality of connection lines and the plurality of bridge lines in the display area, respectively. A DC signal having a constant level is applied to the dummy line.

The dummy line may include: a plurality of horizontal dummy lines extending from the first area to the second area along the first direction; a plurality of first vertical dummy lines located in the first area, the plurality of first vertical dummy lines extending in the second direction; and a plurality of second vertical dummy lines located in the second area, the plurality of second vertical dummy lines extending in the second direction.

The plurality of horizontal dummy lines may be disposed between the plurality of horizontal bridge lines and the plurality of horizontal connection lines, respectively. The plurality of vertical dummy lines may be disposed between the plurality of vertical bridge lines and the plurality of vertical connection lines, respectively.

The plurality of horizontal dummy lines, the plurality of horizontal bridge lines, and the plurality of horizontal connection lines may be disposed in the same layer. The plurality of vertical dummy lines, the plurality of vertical bridge lines, and the plurality of vertical connection lines may be disposed in the same layer.

The plurality of vertical dummy lines, the plurality of vertical bridge lines, and the plurality of vertical connection lines may be disposed in the same layer. The plurality of horizontal dummy lines may be disposed in a layer different from a layer in which the plurality of horizontal bridge lines and the plurality of horizontal connection lines are disposed.

The display device may further include a plurality of sub-pixels which are located in the display area and each includes a light emitting element emitting light and photo sensing pixels which are located in the display area and each including a light receiving element outputting a sensing signal corresponding to the light.

According to an embodiment of the disclosure, an electronic device may include: a processor configured to provide input image data to a display device; and the display device configured to display an image, based on the input image data. The display device includes: a substrate including a display area which includes a first area and a second area, and a non-display area; a plurality of data lines located in the first area and the second area; a plurality of readout lines located in the first area and the second area, the plurality of readout lines being spaced apart from the plurality of data lines; a plurality of connection lines extending from the first area to the second area, the plurality of connection lines being electrically connected to corresponding readout lines disposed in the second area; a plurality of bridge lines extending from the second area to the first area, the plurality of bridge lines being electrically connected to corresponding data lines disposed in the first area; and a plurality of dummy lines disposed between the plurality of connection lines and the plurality of bridge lines in the display area, respectively. A DC signal having a constant level is applied to the dummy line.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration.

It will be understood that in case that an element is referred to as being "between" two elements, it can be the only element between the two elements, or one or more intervening elements may also be present. Like reference numerals refer to like elements throughout.

DETAILED DESCRIPTION

Figure 1:
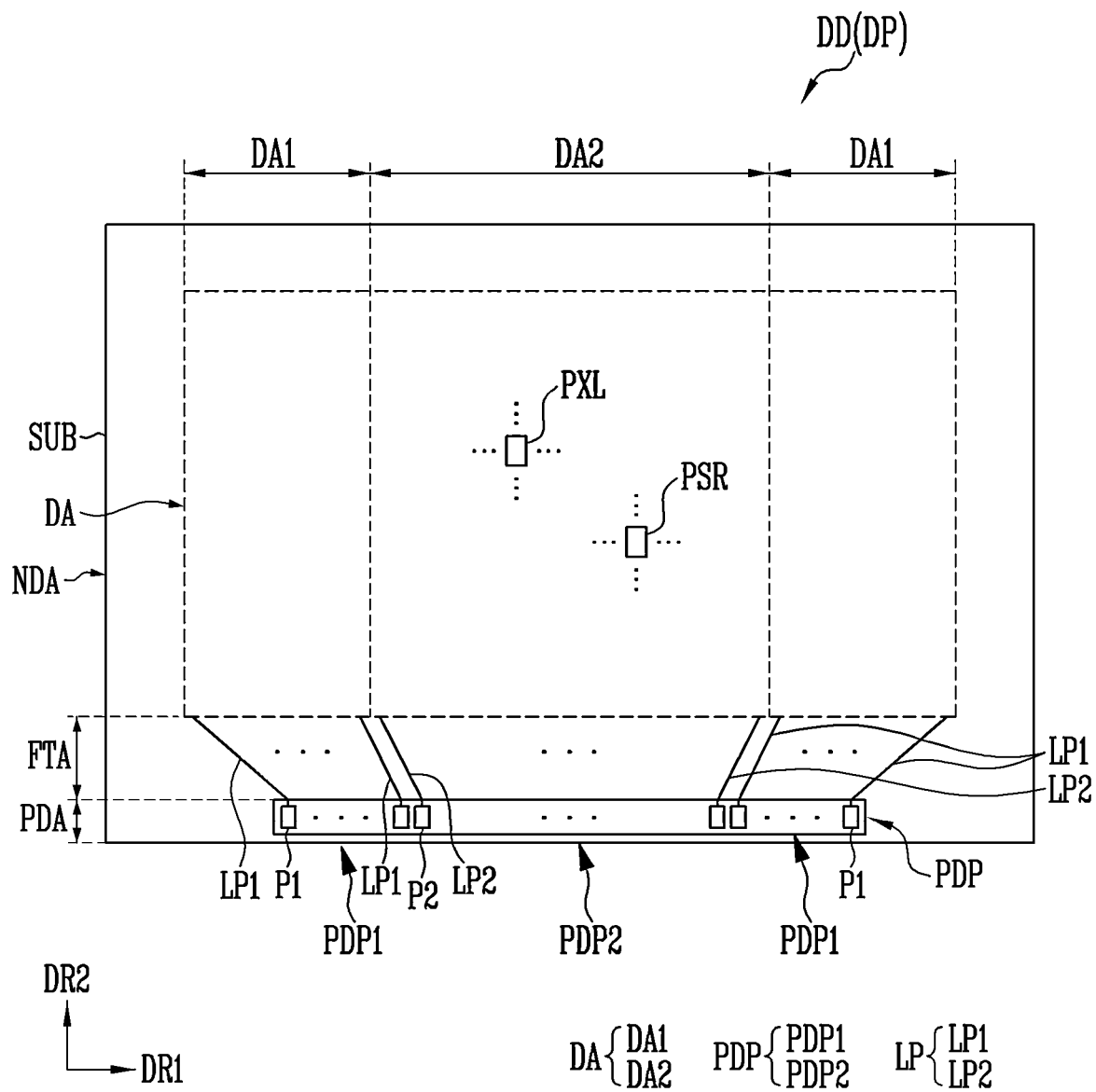
FIGS. 1 and 2 are schematic plan views illustrating a display device in accordance with an embodiment of the present disclosure.

The present disclosure may apply various changes and different shape, therefore only illustrate in detail with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first," "second," etc.

may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including," in case that used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, various embodiments of the present disclosure and items required for those skilled in the art to easily understand the content of the present disclosure will be described in detail with reference to the accompanying drawings. In the following description, singular forms in the present disclosure are intended to include the plural forms as well, unless the context clearly indicates otherwise.

Figure 2:
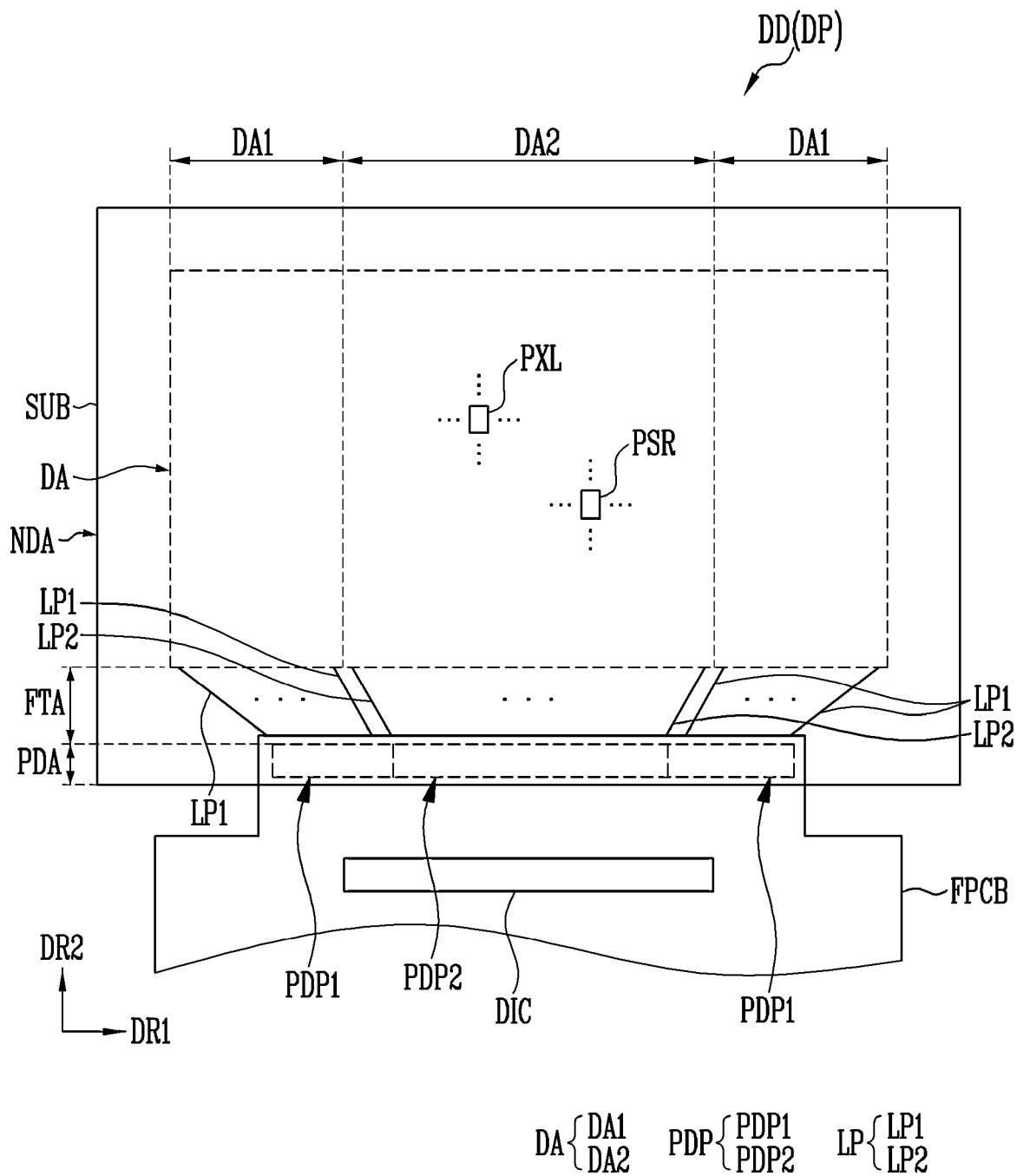

FIGS. 1 and 2 are schematic plan views illustrating a display device DD in accordance with an embodiment of the present disclosure.

In FIGS. 1 and 2, for convenience, a structure of the display device DD, e.g., a display panel DP provided in the display device DD is briefly illustrated based on a display area DA in which an image is displayed.

Referring to FIGS. 1 and 2, the display device DD (or the display panel DP) may include a substrate SUB, sub-pixels PXL, and photo sensing pixels PSR.

The display device DD may be provided in various shapes. For example, the display device DD may be provided in a rectangular plate shape having two pairs of sides parallel to each other, but the present disclosure is not limited thereto. This embodiment may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

The substrate SUB may include a transparent insulating material to enable light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

One area of the substrate SUB may be provided as the display area DA such that the sub-pixels PXL and the photo sensing pixels PSR are disposed therein, and the other area of the substrate SUB may be provided as a non-display area NDA.

In an embodiment, the display area DA may include a first area DA1 and a second area DA2. For example, the display area DA may be partitioned into the first area DA1 and the second area DA2 according to a corresponding relationship between components of a line part LP. For example, the first area DA1 may be one area of the display area DA to which a first line LP1 of the line part LP is connected, and the second area DA2 may be one area of the display area DA to which a second line LP2 of the line part LP is connected.

The first area DA1 may be disposed adjacent to at least one area of the non-display area NDA to which the first line LP1 is connected. For example, the first area DA1 may be disposed on either side of the display panel DP with the second area DA2, to which the second line LP2 is connected, disposed therebetween.

Sub-pixels PXL and photo sensing pixels PSR may be disposed in each of the first area DA1 and the second area DA2.

Each of the sub-pixels PXL may include a light emitting element including a light emitting layer. In some embodiments, the light emitting element may include an organic light emitting diode or an inorganic light emitting diode having a size of micro to nano scale (or meter) range, but the present disclosure is not limited thereto. The display device DD may driver the sub-pixels PXL corresponding to input image data, thereby displaying an image in the first area DA1 and the second area DA2.

The display area DA may include a sensing area capable of sensing a fingerprint of a user, or the like. For example, the first area DA1 and the second area DA2 may be a sensing area capable of a fingerprint of a user, or the like. In case that the display area DA is entirely set as the sensing area, the non-display area NDA surrounding the display area DA may become a non-sensing area.

The photo sensing pixels PSR (or a photo sensor) may be disposed in the first area DA1 and the second area DA2. Each of the photo sensing pixels PSR may include a light receiving element including a light receiving layer. The light receiving layer of the light receiving element may be disposed to be spaced apart from the light emitting layer of the light emitting element in the first area DA1 and the second area DA2.

The photo sensing pixels PSR may sense light emitted from a light source (e.g., the light emitting element) and reflected by an external object (e.g., a finger of the user, or the like). For example, a fingerprint of the user may be sensed through the photo sensing pixels PSR. Hereinafter, a case where the photo sensing pixels PSR is used for fingerprint sensing is described as an example. However, in various embodiments, the photo sensing pixels PSR may sense various biometric information such as an iris and a vein. Also, the photo sensing pixels PSR may sense external light, and perform a function of a gesture sensor, a motion sensor, a proximity sensor, an illuminance sensor, an image sensor, or the like.

The line part LP, a pad part PDP, and/or a built-in circuit part, which are used to drive the sub-pixels PXL and the photo sensing pixels PSR, may be disposed in the non-display area NDA. The non-display area NDA may include a fan-out area FTA and a pad area PDA.

The pad area PDA is one area of the non-display area NDA in which the pad part PDP is located and may be located adjacent to an edge of the non-display area NDA.

The fan-out area FTA is one area of the non-display area NDA in which the line part LP is located, and may be located adjacent to the display area DA in the non-display area NDA. For example, the fan-out area FTA may be one area of the non-display area NDA which is located between the pad area PDA and the display are DA. In some embodiments, the non-display area NDA may include an electrostatic discharge protection circuit area in which an electrostatic discharge protection circuit electrically connected to signal lines located in the display area DA to prevent occurrence of electrostatic discharge is located.

The line part LP may be located in the fan-out area FTA, and the pad part PDP may be located in the pad area PDA.

The line part LP may be electrically connected to the sub-pixels PXL and the photo sensing pixels PSR to transfer a predetermined signal supplied from a driver DIC to the signal lines. The line part LP may include fan-out lines which electrically connect the driver DIC and the sub-pixels PXL to each other and electrically connect the driver DIC and the photo sensing pixels PSR to each other.

In an embodiment, the line part LP may include the first line LP1 and the second line LP2.

The first line LP1 may be disposed in one area of the fan-out area FTA which is located between the first area DA1 and the pad part PDP. The first line LP1 may be provided in plurality and include fan-out lines electrically connected to photo sensing pixels PSR located in the first area DA1. For example, the first line LP1 may include fan-out lines electrically connected to a readout line connected to the photo sensing pixels PSR located in the first area DA1 to transfer an electrical signal (e.g., a sensing signal) received from the photo sensing pixels PSR to the driver DIC.

In an embodiment, the first line LP1 may include fan-out lines electrically connected to a readout line connected to photo sensing pixels PSR located in the second area DA2 through a connection line extending from the first area DA1 to the second area DA2.

The second line LP2 may be disposed in one area of the fan-out area FTA which is located between the second area DA2 and the pad part PDP. The second line LP2 may be provided in plurality and include fan-out lines electrically connected to sub-pixels PXL located in the second area DA2. For example, the second line LP2 may include fan-out lines electrically connected to a data line connected to sub-pixels PXL located in the second area DA2 to transfer a data signal to the sub-pixels PXL.

In an embodiment, the second line LP2 may include fan-out lines electrically connected to data lines connected to sub-pixels PXL located in the first area DA1 through a bridge line extending from the second area DA2 to the first area DA1.

The pad part PDP may be disposed in the pad area PDA and supply driving power sources and signals to the sub-pixels PXL and the photo sensing pixels PSR which are disposed in the display area DA. The pad part PDP may be electrically connected to the line part LP. In an embodiment, the pad part PDP may include a first pad part PDP1 and a second pad part PDP2.

The first pad part PDP1 may include a first pad P1 electrically connected to the first line LP1 and the second pad part PDP2 may include a second pad P2 electrically connected to the second line LP2.

The first pad P1 may be provided in plurality. The first pad P1 may include first pads P1 electrically connected to the readout line connected to the photo sensing pixels PSR located in the first area DA1 through a corresponding first line LP1. Also, the first pad P1 may include first pads P1 electrically connected to the connection line through the corresponding first line LP1.

The second pad P2 may be provided in plurality. The second pad P2 may include second pads P2 electrically connected to the data line connected to the sub-pixels PXL located in the second area DA2 through a corresponding second line LP2. Also, the second pad P2 may include second pads P2 electrically connected to the bridge line through the corresponding second line LP2.

The display device DD may include a circuit board FPCB connected to the display panel DP through the pad part PDP. The circuit board FPCB may be a flexible circuit board, but the present disclosure is not limited thereto.

The circuit board FPCB may process various signals input from a printed circuit board and output the processed signals to the display panel DP. For example, one end of the circuit board FPCB may be attached to the display panel DP, and the other end of the circuit board FPCB, which faces the one end, may be attached to the printed circuit board. The circuit board FPCB may be connected to each of the display panel DP and the printed circuit board by a conductive adhesive member (e.g., an anisotropic conductive film).

The driver DIC may be mounted on the circuit board FPCB. The driver DIC may be, for example, an integrated circuit (IC). The driver DIC may include a panel driver and a fingerprint detector.

The panel driver may supply a data signal corresponding to an image data signal to the sub-pixels PXL while sequentially scanning the sub-pixels PXL. The display panel DP may display an image corresponding to image data. The panel driver may supply a driving signal for fingerprint sensing to the sub-pixels PXL. The driving signal may be provided to allow the sub-pixels PXL to emit light, thereby operating as a light source for the photo sensing pixels PSR. In an embodiment, the panel driver may supplying a driving signal for fingerprint sensing and/or another driving signal to the photo sensing pixels PSR. However, the present disclosure is not limited thereto, and the driving signals for fingerprint sensing may be provided by the fingerprint detector.

The fingerprint detector may detect biometric information such as a fingerprint of a user based on a sensing signal received from the photo sensing pixels PSR. The fingerprint detector may supply driving signals to the photo sensing pixels PSR and/or the sub-pixels PXL.

In the display area DA, the first area DA1 may be located at both sides of the second area DA2. For example, the second area DA2 may be located in the middle of the substrate SUB (or the display device DD), and the first area DA1 may be located at an edge of the substrate SUB. In other words, the second area DA2 may be located at an inside of the substrate SUB, and the first area DA1 may be located at an outside of the substrate SUB.

In the fan-out area FTA, the first line LP1 may be located at both sides of the second line LP2. For example, the second line LP2 may be located in the middle of the fan-out area FTA to correspond to the second area DA2, and the first line LP1 may be located at an edge of the fan-out area FTA to correspond to the first area DA1. In other words, the second line LP2 may be located at an inside of the fan-out area FTA, and the first line LP1 may be located at an outside of the fan-out area FTA. Therefore, the first line LP1 and the second line LP2 may be separated from each other in the fan-out area FTA.

In the pad area PDA, the first pad part PDP1 may be located at both sides of the second pad part PDP2. The second pad part PDP2 may be located in the middle of the pad area PDA to correspond to the second line LP2, and the first pad part PDP1 may be located at an edge of the pad area PDA to correspond to the first line LP1. In other words, the second pad part PDP2 may be located at an inside of the pad area PDA and the first pad part PDP1 may be located at an outside of the pad area PDA.

Figure 3:
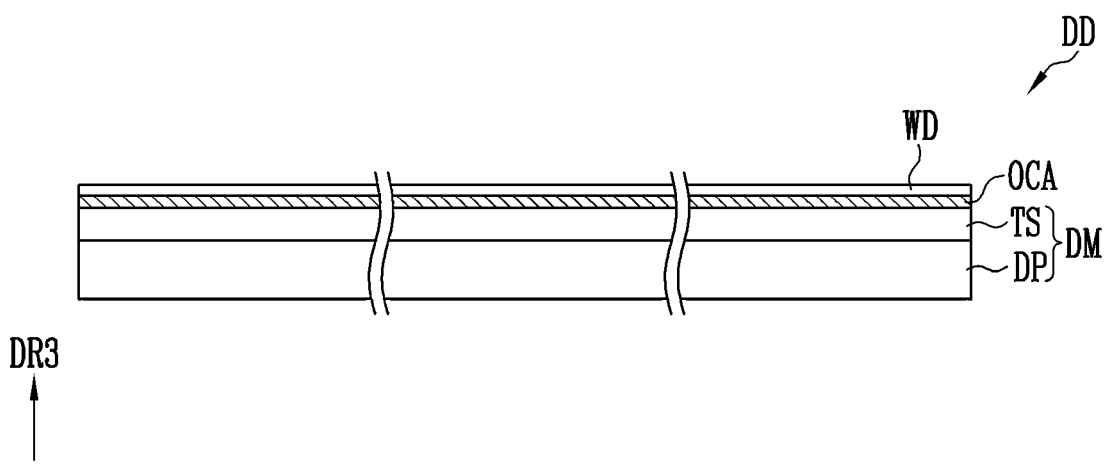
FIG. 3 is a schematic cross-sectional view illustrating a display device in accordance with an embodiment of the present disclosure.

FIG. 3 is a schematic cross-sectional view illustrating a display device DD in accordance with an embodiment of the present disclosure.

Referring to FIGS. 1 to 3, the display device DD may include a display module DM and a window WD.

The display module DM may include a display panel DP and a touch sensor TS.

The touch sensor TS may be disposed directly on the display panel DP, or be disposed on the display panel DP with a separate layer such as an adhesive layer or a substrate (or insulating layer) which is interposed therebetween.

The display panel DP may display an image. A self-luminous display panel such as an Organic Light Emitting Display panel (OLED panel) may be used as the display panel DP. A non-self-luminous display panel, such as a Liquid Crystal Display panel (LCD panel), an Electro-Phoretic Display panel (EPD panel), or an Electro-Wetting Display panel (EWD panel), may be used as the display panel DP. In case that the non-self-luminous display panel is used as the display panel DP, the display device DD may include a backlight unit for supplying light to the display panel DP.

The touch sensor TS may be disposed on a surface of the display panel DP from which an image is emitted to receive a touch input of a user. The touch sensor TS may recognize a touch event of the display device DD through a hand of the user or a separate input means. The touch sensor TS may recognize the touch event using a capacitance method.

The touch sensor TS may sense a touch input using a mutual capacitance method, or sense the touch input using a self-capacitance method.

The window WD for protecting an exposed surface of the display module DM may be provided on the display module DM. The window WD may protect the display module DM from external impact and provide an input surface and/or a display surface to the user. The window WD may be coupled to the display module DM using an optical transparent adhesive member OCA.

The window WD (or cover glass) may have a multi-layer structure selected from a glass substrate, a plastic film, and a plastic substrate. The multi-layer structure may be formed through a continuous process or an adhesion process using an adhesive layer. The whole or a portion of the window WD may have flexibility.

Figure 4:
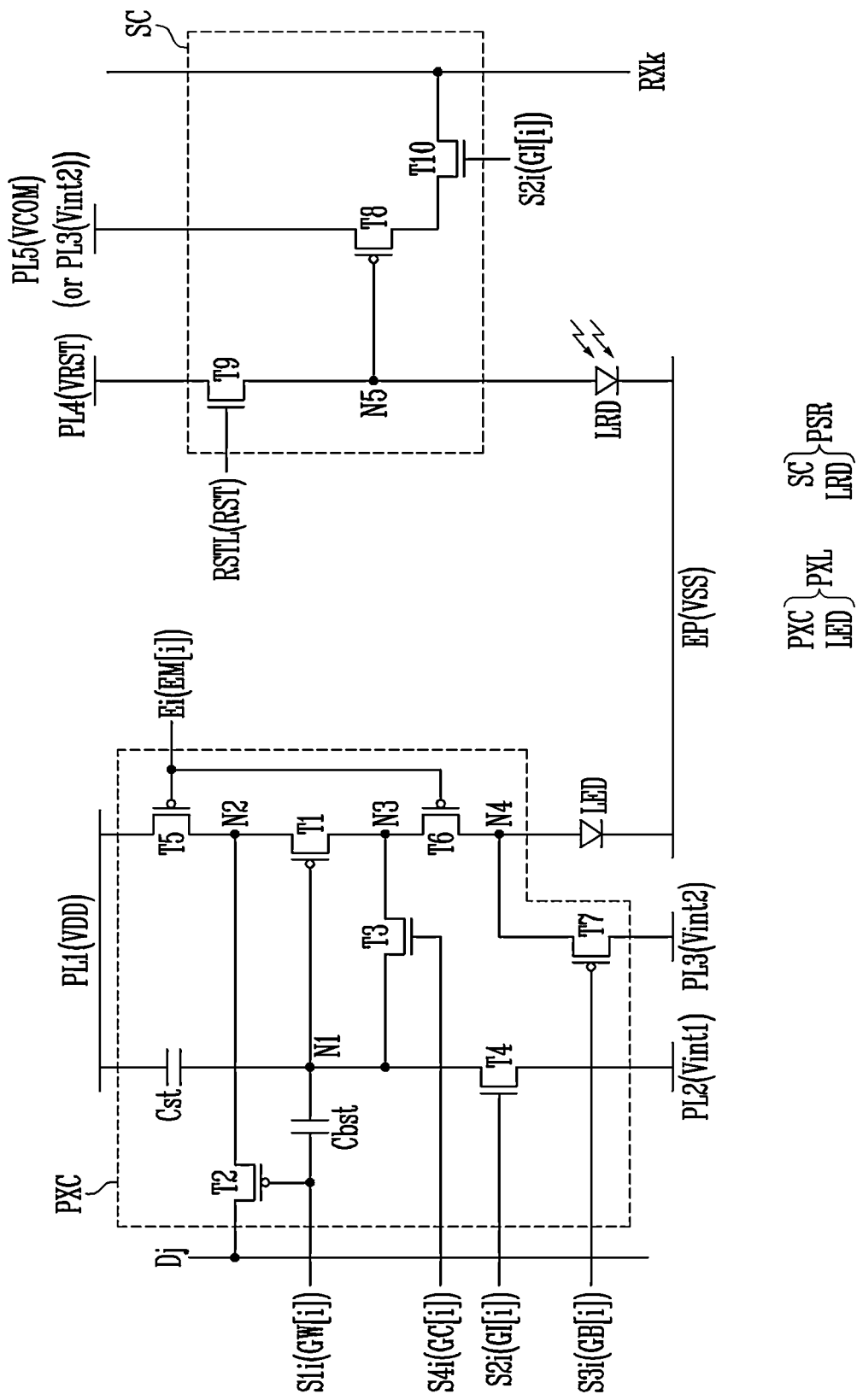
FIG. 4 is a circuit diagram illustrating an example of a sub-pixel and a photo sensing pixel, which are included in a display area shown in FIG. 1.

FIG. 4 is a circuit diagram illustrating an example of the sub-pixel PXL and the photo sensing pixel PSR which are included in the display area shown in FIG. 1. For convenience of description, a sub-pixel PXL which is located on an ith horizontal line (or ith pixel row) and is connected to a jth data line Dj is illustrated in FIG. 4.

Referring to FIGS. 1 to 4, the sub-pixel PXL and the photo sensing pixel PSR may be disposed on the ith horizontal line.

The sub-pixel PXL may include a light emitting element LED and a pixel circuit PXC. In an embodiment, the pixel circuit PXC may include a first transistor T1, a second transistor T2, a third transistor T3, a fourth transistor T4, a fifth transistor T5, a sixth transistor T6, and a seventh transistor T7, a storage capacitor Cst, and a boost capacitor Cbst.

The first transistor T1 (or driving transistor) may be electrically connected between a first power line PL1 and a first electrode of the light emitting element LED. The first transistor T1 may include a gate electrode electrically connected to a first node N1. The first transistor T1 may control an amount of current (or driving current) flowing from the first power line PL1 to an electrode EP (or power line) via the light emitting element LED based on a voltage of the first node N1. A first power voltage VDD may be provided to the first power line PL1 and a second power voltage VSS may be provided to the electrode EP. The first power voltage VDD may be set as a voltage higher than the second power voltage VSS.

The second transistor T2 may be electrically connected between the jth data line Dj and a second node N2. A gate electrode of the second transistor T2 may be connected to a 1ith scan line Sli (or first scan line). The second transistor T2 may be turned on in response to a first scan signal GW[i] (e.g., a first scan signal having a low level) which is supplied from the 1ith scan line S1$i$ to electrically connect the jth data line Dj and the second node N2 to each other. In case that the second transistor T2 is in a turn-on state, the second transistor T2 may transfer a data signal of the jth data line Dj to the second node N2 in response to the first scan signal GW[i].

The third transistor T3 may be electrically connected between the first node N1 and a third node N3. A gate electrode of the third transistor T3 may be electrically connected to a 4ith scan line S4$i$ (or a third scan line). The third transistor T3 may be turned on in case that a fourth scan signal GC[i] is supplied to the 4ith scan line S4$i$. In case that the third transistor T3 is turned on, the first transistor T1 may have a diode-connected form.

The fourth transistor T4 may be electrically connected between the first node N1 and a second power line PL2. A gate electrode of the fourth transistor T4 may be electrically connected to a 2ith scan line S2$i$ (or second scan line). A first initialization power voltage Vint1 may be provided from the second power line PL2. The fourth transistor T4 may be turned on by a second scan signal GI[i] supplied to the 2ith scan line S2$i$. In case that the fourth transistor T4 is turned on, the first initialization power voltage Vint1 may be supplied to the first node N1 (i.e., the gate electrode of the first transistor T1).

The fifth transistor T5 may be electrically connected between the first power line PL1 and the second node N2. A gate electrode of the fifth transistor T5 may be electrically connected to an ith emission control line Ei. The sixth transistor T6 may be electrically connected between the third node N3 and the light emitting element LED (or a fourth node N4). The fifth transistor T5 and the sixth transistor T6 may be turned off in case that an emission control signal EM[i] (e.g., the emission control signal EM[i] having a high level) is supplied to the ith emission control line Ei, and be turned on in other cases.

The seventh transistor T7 may be electrically connected between the first electrode of the light emitting element LED (i.e., the fourth node N4) and a third power line PL3. A gate electrode of the seventh transistor T7 may be electrically connected to a 3ith scan line S3$i$. A second initialization power voltage Vint2 may be provided from the third power line PL3. In some embodiments, the second initialization power voltage Vint2 may be different from the first initialization power voltage Vint1. The seventh transistor T7 may be turned on by a third scan signal GB [i] supplied to the 3ith scan line S3$i$ to supply the second initialization power voltage Vint2 to the first electrode of the light emitting element LED.

The storage capacitor Cst may be connected or formed between the first power line PL1 and the first node N1.

The boost capacitor Cbst (or capacitor) may be connected or formed between the gate electrode of the second transistor T2 and the gate electrode of the first transistor T1.

The photo sensing pixel PSR may include a sensor circuit SC and a light receiving element LRD. The sensor circuit SC may include an eighth transistor T8, a ninth transistor T9, and a tenth transistor T10.

The eighth and tenth transistors T8 and T10 may be connected in series between a fifth power line PL5 and a kth readout line RXk (k is a natural number).

The eighth transistor T8 (or first sensor transistor) may be electrically connected between the fifth power line PL5 and the tenth transistor T10. A gate electrode of the eighth transistor T8 may be electrically connected to a fifth node N5 (or sensor node). The eighth transistor T8 may control a current flowing from the fifth power line PL5 to the kth readout line RXk through the tenth transistor T10 in response to a voltage of the fifth node N5. A common voltage VCOM may be provided to the fifth power line PL5.

In some embodiments, the fifth power line PL5 may be electrically connected to or integrally formed with the third power line PL3, and the common voltage VCOM applied to the fifth power line PL5 may be equal to the second power voltage Vint2. However, the present disclosure is not limited thereto. In other embodiments, the common voltage VCOM applied to the fifth power line PL5 may be equal to the first initialization power voltage Vint1.

The tenth transistor T10 ("second sensor transistor" or "switching transistor") may be electrically connected between the eighth transistor T8 and the kth readout line RXk. A gate electrode of the tenth transistor T10 may be electrically connected to the 2ith scan line S2$i$. The gate electrode of the tenth transistor T10 and the gate electrode of the fourth transistor T4 may share the 2ith scan line S2$i$.

The ninth transistor T9 (or third sensor transistor) may be electrically connected between a fourth power line PL4 (or reference power line) and the fifth node N5. A gate electrode of the ninth transistor T9 may be electrically connected to a reset control line RSTL. A reset voltage VRST may be provided to the fourth power line PL4. The reset voltage VRST may be a DC voltage having a constant level. For example, the reset voltage VRST may be about −7V.

At least one light receiving element LRD may be electrically connected between the fifth node N5 and the electrode EP to which the second power voltage VSS is provided. The light receiving element LRD may generate charges (or current) based on incident light. The light receiving element LRD may perform of a function of photoelectric transformation. For example, the light receiving element LRD may be implemented as a photo diode.

In case that the ninth transistor T9 is turned on by a reset signal RST supplied to the reset control line RSTL, the reset voltage VRST may be supplied to the fifth node N5. For example, the voltage of the fifth node N5 may be reset by the reset voltage VRST. The light receiving element LRD may perform the function of photoelectric transformation from after the reset voltage VRST is applied to the fifth node N5.

The voltage of the fifth node N5 may be changed by an operation of the light receiving element LRD. The voltage of the fifth node N5 (or charges or current generated in the light receiving element LED) may be changed according to an intensity of light incident onto the light receiving element LRD and a time for which the light is incident (or a time for which the light receiving element LRD is exposed by the light).

In case that the tenth transistor T10 is turned on when the second scan signal GI[i] supplied to the 2ith scan line S2$i$, a detection value (current and/or voltage) generated based on the voltage of the fifth node N5 may flow into the kth readout line RXk.

In an embodiment, each of the pixel circuit PXC and the sensor circuit SC may include P-type and N-type transistors. Each of the third transistor T3, the fourth transistor T4, the ninth transistor T9, and the tenth transistor T10 may be formed as an oxide semiconductor transistor including an oxide semiconductor (or second type semiconductor). For example, each of the third transistor T3, the fourth transistor T4, the ninth transistor T9, and the tenth transistor T10 may be an N-type oxide semiconductor transistor and include an oxide semiconductor layer as an active layer. However, the present disclosure is not limited thereto.

Each of the other transistors (e.g., the first, second, fifth, sixth, seventh, and eighth transistors T1, T2, T5, T6, T7, and T8 may be formed as a poly-silicon transistor including a silicon semiconductor (or first type semiconductor), and include a poly-silicon semiconductor layer as an active layer. For example, the active layer may be formed through a low temperature poly-silicon (LTPS) process.

Hereinafter, a stacked structure (or sectional structure) of the sub-pixel PXL including the light emitting element LED and the photo sensing pixel PSR including the light receiving element LRD will be mainly described with reference to FIGS. 5 and 6.

Figure 5:
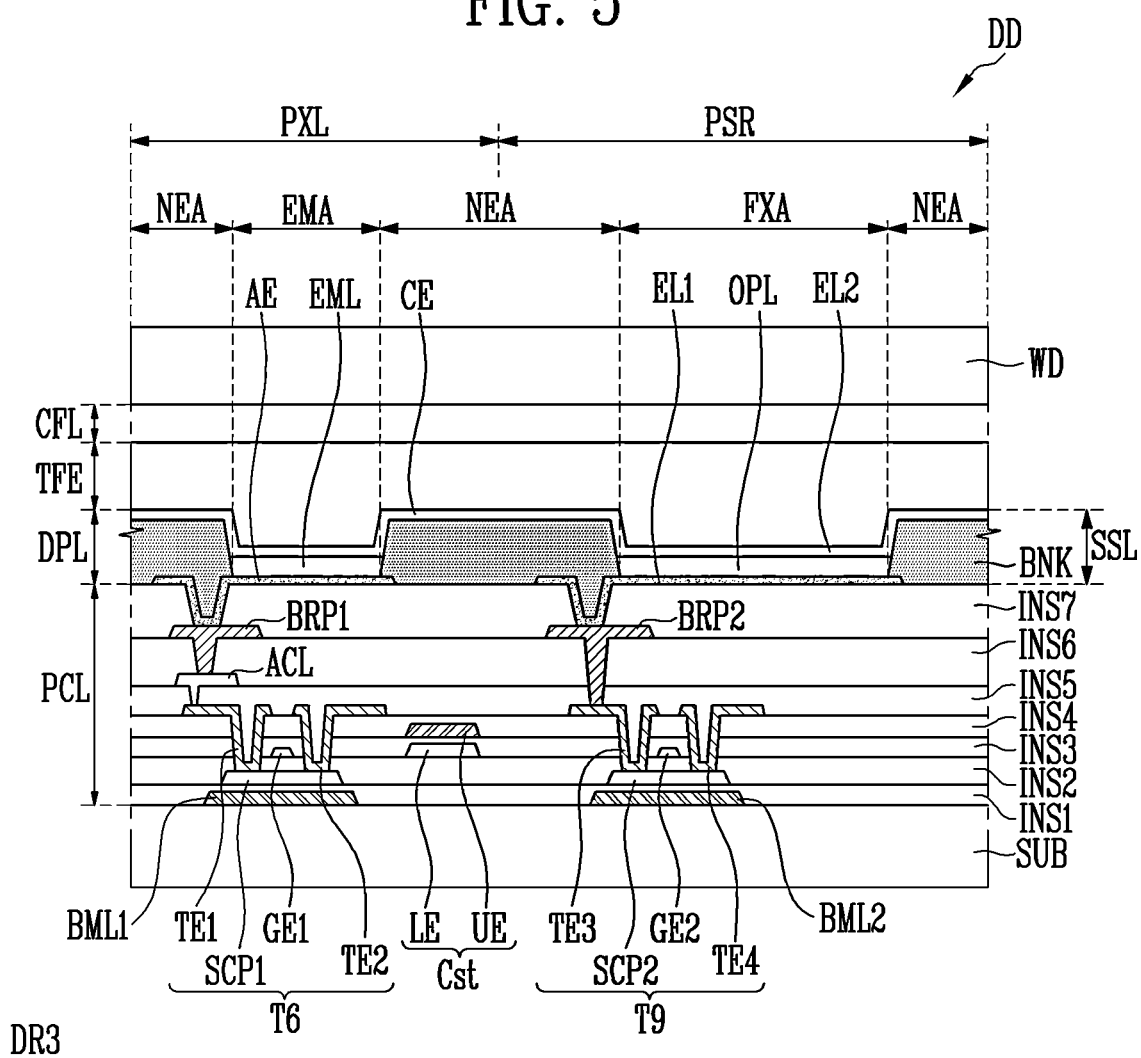
FIG. 5 is a schematic cross-sectional view illustrating one area of a display device in accordance with an embodiment of the present disclosure.

FIG. 5 is a schematic cross-sectional view illustrating one area of a display device DD in accordance with an embodiment of the present disclosure. FIG. 6 is a schematic cross-sectional view illustrating a reflection path of light in the display device DD shown in FIG. 5.

Figure 6:
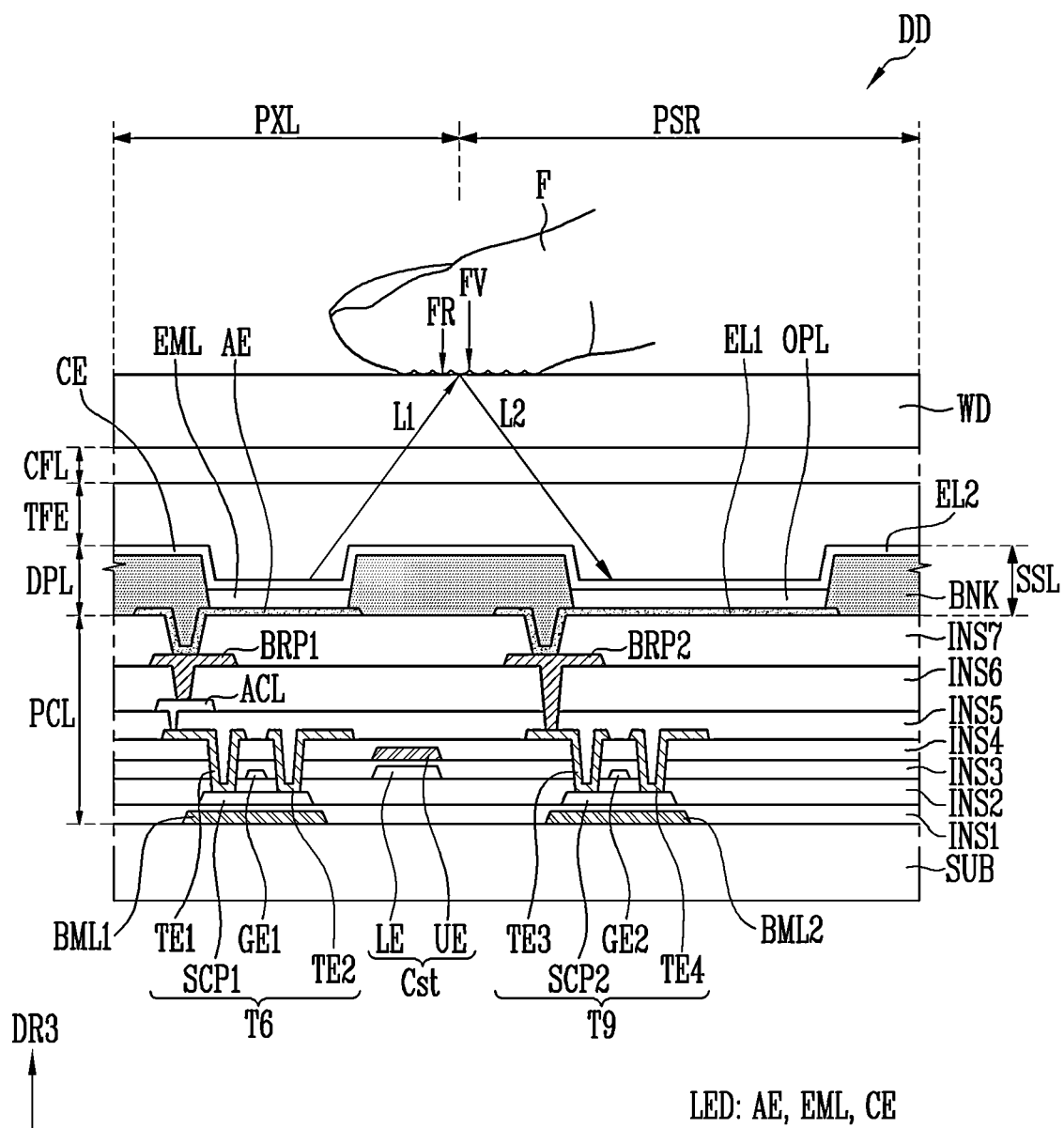
FIG. 6 is a schematic cross-sectional view illustrating a reflection path of light in the display device shown in FIG. 5.

In FIGS. 5 and 6, the sixth transistor T6 among the first to seventh transistors T1 to T7 shown in FIG. 4 and the ninth transistor T9 among the eighth to tenth transistors T8 to T10 shown in FIG. 4 are illustrated.

Referring to FIGS. 1 to 6, the display device DD may include a sub-pixel PXL and a photo sensing pixel PSR which are disposed on a substrate SUB.

A pixel circuit layer PCL of the sub-pixel PXL and a pixel circuit layer PCL of the photo sensing pixel PSR may be disposed on the substrate SUB. The pixel circuit layer PCL may include a first insulating layer INS, a second insulating layer INS2, a third insulating layer INS3, a fourth insulating layer INS4, a fifth insulating layer INS5, a sixth insulating layer INS6, and a seventh insulating layer INS7, which are sequentially stacked on the substrate SUB along a third direction DR3.

The first insulating layer INS1 (or buffer layer) may be entirely disposed on the substrate SUB. The first insulating layer INS1 may prevent an impurity from being diffused into the sixth transistor T6 and the ninth transistor T9. The first insulating layer INS1 may be an inorganic insulating layer including an inorganic material (or substance). The first insulating layer INS1 may include at least one of silicon nitride ($SiN_x$), silicon oxide ($SiO_x$), silicon oxynitride ($SiO_xN_y$), and aluminum oxide ($AlO_x$). The first insulating layer INS1 may be provided as a single layer, but be provided as a multi-layer including at least two layers. The first insulating layer INS1 may be omitted according to a material of the substrate SUB, a process condition, and the like.

The second insulating layer INS2 (or a first gate insulating layer) may be entirely disposed on the first insulating layer INS1. The second insulating layer INS2 may include the same material as the first insulating layer INS1, or include a material appropriate (or selected) from the materials disclosed as the material constituting the first insulating layer INS1. For example, the second insulating layer INS2 may be an inorganic layer including an inorganic material.

The third insulating layer INS3 (or a second gate insulating layer) may be entirely disposed on the second insulating layer INS2. The third insulating layer INS3 may include the same material as the first insulating layer INS1, or include at least one material appropriate (or selected) from the materials disclosed as the material constituting the first insulating layer INS1. For example, the second insulating layer INS2 may be an inorganic layer including an inorganic material.

The fourth insulating layer INS4 (or interlayer insulating layer) may be entirely disposed on the third insulating layer INS3. The fourth insulating layer INS4 may be an inorganic layer including an inorganic material or an organic layer including an organic material.

The fifth insulating layer INS5 (or passivation layer) may be entirely disposed on the fourth insulating layer INS4. The fifth insulating layer INS5 may be an inorganic layer including an inorganic material or an organic layer including an organic material. The sixth insulating layer INS6 (or first via layer) may be entirely disposed on the fifth insulating layer INS5. The sixth insulating layer INS6 may be an inorganic layer including an inorganic material or an organic layer including an organic material. The inorganic layer may include, for example, at least one of silicon oxide ($SiO_x$), silicon nitride ($SiN_x$), silicon oxynitride ($SiO_xN_y$), and aluminum oxide ($AlO_x$). The organic layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The seventh insulating layer INS7 (or a second via layer) may be entirely disposed on the sixth insulating layer INS6. The seventh insulating layer INS7 may include the same material as the sixth insulating layer INS6, or include at least one material appropriate (or selected) from the materials disclosed as the material constituting the sixth insulating layer INS6. For example, the second insulating layer INS2 may be an organic layer including an organic material.

At least one conductive layer disposed between the above-described insulating layers may be included in the pixel circuit layer PCL. For example, the conductive layers may include a first conductive layer C1 provided between the substrate SUB and the first insulating layer INS1, a second conductive layer C2 disposed on the second insulating layer INS2, a third conductive layer C3 disposed on the third insulating layer INS3, a fourth conductive layer C4 disposed on the fourth insulating layer INS4, a fifth conductive layer C5 disposed on the fifth insulating layer INS5, and a sixth conductive layer C6 disposed on the sixth insulating layer INS6. The insulating layers and the conductive layers are not limited to the above-described embodiment. In some embodiments, other insulating layer and other conductive layer in addition to the insulating layers and the conductive layers illustrated herein above may be disposed in the pixel circuit layer PCL.

The sixth transistor T6 and the ninth transistor T9 may be disposed in the pixel circuit layer PCL. The sixth transistor T6 may include a first gate electrode GE1, a first semiconductor pattern SCP1, a first terminal TE1, and a second terminal TE2. The ninth transistor T9 may include a second gate electrode GE2, a second semiconductor pattern SCP2, a third terminal TE3, and a fourth terminal TE4.

The first semiconductor pattern SCP1 and the second semiconductor pattern SCP2 may be disposed on the first insulating layer INS1. The first semiconductor pattern SCP1 may include a poly-silicon semiconductor, and the second semiconductor pattern SCP2 may include an oxide semiconductor. For convenience, although it is illustrated that the first semiconductor pattern SCP1 including the poly-silicon semiconductor and the second semiconductor pattern SCP2 including the oxide semiconductor are formed in the same layer, the first semiconductor pattern SCP1 and the second semiconductor pattern SCP2 are not formed in the same layer but may be formed through different processes to be formed in different layers. Each of the first semiconductor pattern SCP1 and the second semiconductor pattern SCP2 may include a channel region, a first contact region connected to one end of the channel region, and a second contact region connected to the other end of the channel region. The first contact region may be a source region, and the second contact region may be a drain region. The second insulating layer INS2 may be disposed over the first semiconductor pattern SCP1 and the second semiconductor pattern SCP2.

The first gate electrode GE1 and the second gate electrode GE2 may be configured as the second conductive layer C2 disposed on the second insulating layer INS2. For convenience, although it is illustrated that the first gate electrode GE1 and the second gate electrode GE2 are formed in the same layer, the first gate electrode GE1 disposed on the first semiconductor pattern SCP1 and the second gate electrode GE2 disposed on the second semiconductor layer SCP2 are not formed in the same layer but may be formed through different processes to be formed in different layers. The second conductive layer C2 may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or ally thereof. For example, the second conductive layer C2 may be formed as a multi-layer in which titanium (Ti), copper (Cu), and/or indium tin oxide (ITO) are sequentially or repeatedly stacked. The first gate electrode GE1 may overlap with one region of the first semiconductor pattern SCP1. The one region of the first semiconductor pattern SCP1, which overlaps with the first gate electrode GE1, may be the channel region of the sixth transistor T6. The second gate electrode GE2 may overlap with one region of the second semiconductor pattern SCP2. The one region of the second semiconductor pattern SCP2, which overlaps with the second gate electrode GE2, may be the channel region of the ninth transistor T9.

The third insulating layer INS3 may be disposed over the first gate electrode GE1 and the second gate electrode GE2.

The first terminal TE1, the second terminal TE2, the third terminal TE3, and the fourth terminal TE4 may be configured as the fourth conductive layer C4 disposed on the fourth insulating layer INS4. The fourth conductive layer C4 may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or ally thereof.

The first terminal TE1 may be electrically connected to the second contact region of the first semiconductor pattern SCP1 through a contact hole formed through the second insulating layer INS2, the third insulating layer INS3, and the fourth insulating layer INS4. The first terminal TE1 may be electrically connected to an anode electrode AE of a light emitting element LED.

The second terminal TE2 may be electrically connected to the first contact region of the first semiconductor pattern SCP1 through another contact hole formed through the second insulating layer INS2, the third insulating layer INS3, and the fourth insulating layer INS4.

The third terminal TE3 may be electrically connected to the first contact region of the second semiconductor pattern SCP2 through still another contact hole formed through the second insulating layer INS2, the third insulating layer INS3, and the fourth insulating layer INS4. The third terminal TE3 may be electrically connected to a first electrode EL1 of a light receiving element LRD.

The fourth terminal TE4 may be electrically connected to the second contact region of the second semiconductor pattern SCP2 through still another contact hole formed through the second insulating layer INS2, the third insulating layer INS3, and the fourth insulating layer INS4.

The first terminal TE1, the second terminal TE2, the third terminal TE3, and the fourth terminal TE4 may include the same material as the second conductive layer C2 or the third conductive layer C3, or include a material appropriate (or selected) from the materials disclosed as the material constituting the second conductive layer C2 or the third conductive layer C3. The fifth insulating layer INS5 may be disposed over the first terminal TE1, the second terminal TE2, the third terminal TE3, and the fourth terminal TE4.

A first bottom metal pattern BML1 and a second bottom metal pattern BML2 may be disposed in the pixel circuit layer PCL. The first bottom metal pattern BML1 may be configured as the first conductive layer C1 disposed on the substrate SUB, and overlap with the sixth transistor T6. The second bottom metal pattern BML2 may be configured as the first conductive layer C1 disposed on the substrate SUB, and overlap with the ninth transistor T9. In some embodiments, the first bottom metal pattern BML1 may be electrically connected to the sixth transistor T6 to stabilize the channel region of the sixth transistor T6. The second bottom metal pattern BML2 may be electrically connected to the ninth transistor T9 to stabilize the channel region of the ninth transistor T9.

A storage capacitor Cst may be disposed in the pixel circuit layer PCL. The storage capacitor Cst may include a lower electrode LE and an upper electrode UE. The lower electrode LE may be configured as the second conductive layer C2. The third insulating layer INS3 may be disposed over the lower electrode LE. The upper electrode UE may be disposed on the third insulating layer INS3. The upper electrode UE may overlap with the lower electrode LE in a plan view with the third insulating layer INS3 interposed therebetween. The upper electrode UE may be configured as the third conductive layer C3, but the present disclosure is not limited thereto. The upper electrode UE may overlap with the lower electrode LE with the third insulating layer IN3 interposed therebetween, thereby forming a capacitance.

An anode connection part ACL, a first bridge pattern BRP1, and a second bridge pattern BRP2 may be disposed in the pixel circuit layer PCL.

The anode connection part ACL may be configured as the fifth conductive layer C5 disposed on the fifth insulating layer INS5. The anode connection part ACL may be electrically connected to the first terminal TE1 through a contact hole formed through the fifth insulating layer INS5. The anode connection part ACL may include the same material as the second conductive layer C2 or the third conductive layer C3, or include a material appropriate (or selected) from the materials disclosed as the material constituting the second conductive layer C2 or the third conductive layer C3. The sixth insulating layer INS6 may be disposed over the anode connection part ACL.

The first bridge pattern BRP1 and the second bridge pattern BRP2 may be configured as the sixth conductive layer C6. The first bridge pattern BRP1 and the second bridge pattern BRP2 may be disposed on the sixth insulating layer INS6 to be spaced apart from each other. The first bridge pattern BRP1 and the second bridge pattern BRP2 may include the same material as the second conductive layer C2 or the third conductive layer C3, or include a material appropriate (or selected) from the materials disclosed as the material constituting the second conductive layer C2 or the third conductive layer C3.

The first bridge pattern BRP1 may be electrically connected to the anode connection part ACL through a contact hole formed through the sixth insulating layer INS6. The second bridge pattern BRP2 may be electrically connected to the third terminal TE3 through a contact hole formed through the sixth insulating layer INS6 and the fifth insulating layer INS5. The seventh insulating layer INS7 may be disposed over the first bridge pattern BRP1 and the second bridge pattern BRP2.

A display element layer DPL may be disposed on the pixel circuit layer PCL of the sub-pixel PXL, and a sensor layer SSL may be disposed on the pixel circuit layer PCL of the photo sensing pixel PSR.

The light emitting element LED and a bank BNK may be disposed in the display element layer DPL. The light emitting element LED may include the anode electrode AE (or pixel electrode), a light emitting layer EML, and a cathode electrode CE (or common electrode). The light emitting element LED may be electrically connected to the sixth transistor T6. The light emitting layer EML may include a hole transport layer, an organic material layer (or light generation layer), and an electron transport layer.

The light receiving element LRD and a bank BNK may be disposed in the sensor layer SSL. The light receiving element LRD may be an optical type fingerprint sensor. The light receiving element LRD may sense light reflected by ridges FR and valleys FV between the ridges FR of a finger F of a user, thereby recognizing a fingerprint. For example, in case that the finger F of the user is in contact with a window WD on the window WD, first light L1 output from the light emitting element LED (or the light emitting layer EML) may be reflected by the ridge FR or the valley FV of the finger F, and reflected second light L2 may reach the light receiving element LRD (or a light receiving layer OPL) of the sensor layer SSL. The light receiving element LRD may distinguish second light L2 reflected from the ridge FR of the finger F and reflected from the valley FV of the finger F, thereby recognizing a pattern of a user fingerprint. The light receiving element LRD may be electrically connected to the ninth transistor T9. The light receiving element LRD may include the first electrode EL1 (or first sensor electrode), the light receiving layer OPL (or photoelectric transformation layer), and a second electrode EL2 (or second sensor electrode).

The anode electrode AE and the first electrode EL1 may be disposed on the seventh insulating layer INS7. The anode electrode AE and the first electrode EL1 may be made of a metal layer such as silver (Ag), magnesium (Mg), aluminum (Al), platinum (Pt), palladium (Pd), gold (Au), nickel (Ni), neodymium (Nd), iridium (Ir), chromium (Cr) or any alloy thereof, and/or indium tin oxide (ITO), indium zinc oxide (IZO), zinc oxide (ZnO) or indium tin zinc oxide (ITZO). The anode electrode AE may be electrically connected to the first bridge pattern BRP1 through a contact hole formed through the seventh insulating layer INS7. The first electrode EL1 may be electrically connected to the second bridge electrode BRP2 through another contact hole formed through the seventh insulating layer INS7.

The anode electrode AE and the first electrode EL1 may be simultaneously formed through patterning using a mask.

The bank BNK may be disposed on the anode electrode AE, the first electrode EL1, and the seventh insulating layer INS7.

The bank BNK may be a pixel defining layer defining (or partitioning) an emission area EMA of the sub-pixel PXL and a light receiving area FXA of the photo sensing pixel PSR. The bank BNK may be an organic layer including an organic material (or substance). The organic material may include acrylic resin, epoxy resin, phenolic resin, polyamide resin, polyimide resin, and the like.

In some embodiments, the bank BNK may include a light absorption material, or have a light absorber applied thereon, to absorb light introduced from the outside. For example, the bank BNK may include a carbon-based black pigment. However, the present disclosure is not limited thereto, and the bank BNK may include an opaque metal material such as chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has a high light absorption rate.

The bank BNK may include openings corresponding to the emission area EMA and the light receiving area FXA.

The light emitting layer EML may be disposed on the anode electrode AE. The light emitting layer EML may include an organic light emitting layer. The light emitting layer EML may emit light such as red light, green light, or blue light according to an organic material, but the present disclosure is not limited thereto.

The light receiving layer OPL may be disposed on the first electrode EL1. The light receiving layer OPL may emit electrons corresponding to light in a specific wavelength band, thereby sensing an intensity of the light.

The light receiving layer OPL may include a low molecular organic material (or substance). For example, the light receiving layer OPL may be formed of a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the low molecular organic material included in the light receiving layer OPL may be configured as a bi-layer including a layer including a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), and a layer including carbon 60 (C60), or be configured as a single mixed layer in which a phthalocyanine compound and C60 are mixed with each other.

However, this is merely illustrative, and the light receiving layer OPL may include a polymer organic layer.

In an embodiment, according to a selection of a metal component included in the phthalocyanine compound, the light receiving layer OPL may determine a light detection band of a photo sensor. For example, the phthalocyanine compound including copper absorbs a visible light wavelength of a band of about 600 nm to about 800 nm. The phthalocyanine compound including tin (Sn) absorbs a near-infrared light wavelength of a band of about 800 nm to about 1000 nm. Thus, as the selection of a metal included in the phthalocyanine compound is controlled, a photo sensor capable of detecting a wavelength of a band required by a user can be implemented. For example, the light receiving element LRD may be formed to selectively absorb a wavelength of a red light band, a wavelength of a green light band, or a wavelength of a blue light through the light receiving layer OPL.

The cathode electrode CE may be disposed on the light emitting layer EML, and the second electrode EL2 may be disposed on the light receiving layer OPL. The cathode electrode CE and the second electrode EL2 may correspond to a common electrode integrally formed in the display area DA. The second power voltage VSS may be supplied to the cathode electrode CE and the second electrode EL2.

The cathode electrode CE and the second electrode EL2 may be formed of a metal layer such as Ag, Mg, Al, Pt, Pd, Au, Ni, Nd, Ir or Cr, and/or a transparent conductive layer such as ITO, IZO, ZnO or ITZO. In an embodiment, the cathode electrode CE and the second electrode EL2 may be formed as a multi-layer including at least two layers including a thin metal layer. For example, the cathode electrode CE and the second electrode EL2 may be formed as a triple layer of ITO/Ag/ITO.

A thin film encapsulation layer TFE may be entirely formed on the cathode electrode CE and the second electrode EL2.

The thin film encapsulation layer TFE may be formed as a single layer, but be formed as a multi-layer. The thin film encapsulation layer TFE may include a plurality of insulating layers covering the light emitting element LED and the light receiving element LRD. The thin film encapsulation layer TFE may include at least one inorganic layer and at least one organic layer. For example, the thin film encapsulation layer TFE may have a structure in which an inorganic layer and an organic layer are alternately stacked.

A color filter layer CFL may be disposed on the thin film encapsulation layer TFE. The color filter layer CFL may include a light blocking pattern and a color filter. The light blocking pattern may be disposed in a non-emission area NEA surrounding the emission area EMA of the sub-pixel PXL and the light receiving area FXA of the photo sensing pixel PSR, and the color filter may be disposed in the emission area EMA and the light receiving area FXA. The above-described color filter layer CFL may be used as an anti-reflection layer which blocks external light reflection.

The window WD may be disposed on the color filter layer CFL.

Figure 7:
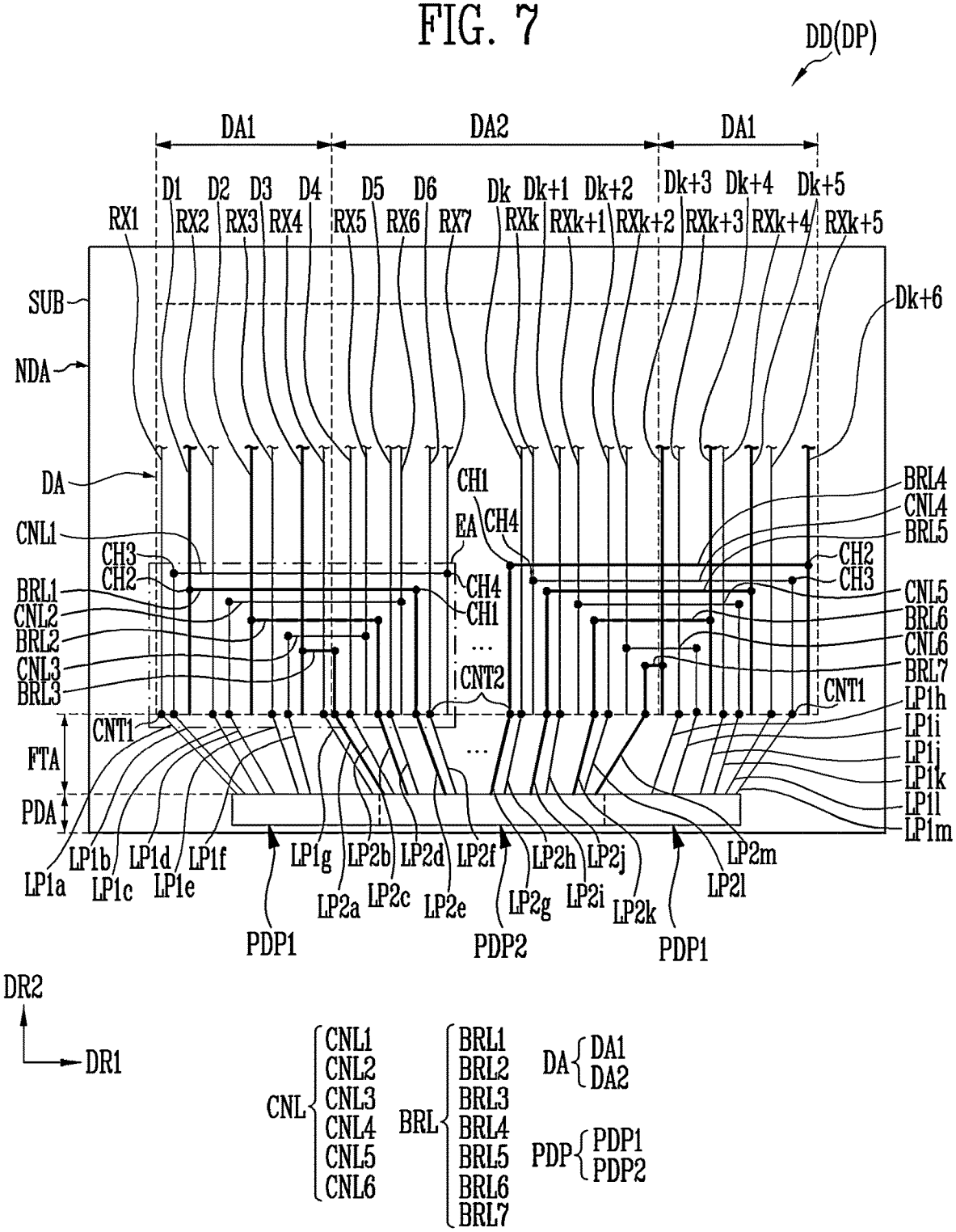
FIG. 7 is a plan view schematically illustrating data lines, readout lines, a bridge line, a connection line, first lines, and second lines of the display device shown in FIG. 1.

FIG. 7 is a plan view schematically illustrating data lines D1 to Dk+6, readout lines RX1 to RXk+5, a bridge line BRL, a connection line CNL, first lines LP1a to LP1m, and second lines LP2a to LP2m of the display device DD shown in FIG. 1.

In FIG. 7, portions different from those of the above-described embodiment will be described to avoid redundancy.

Referring to FIGS. 1 to 7, the display device DD (or the display panel DP) may include a substrate SUB, a line part (see "LP" shown in FIG. 1), and a pad part PDP.

The pad part PDP may be located in the pad area PDA, and include a first pad part PDP1 and a second pad part PDP2 which are electrically connected to the line part LP. The first pad part PDP1 may include a first pad P1 electrically connected to a first line (see "LP1" shown in FIG. 1), and the second pad part PDP2 may include a second pad P2 electrically connected to a second line (see "LP2" shown in FIG. 1). The first pad part PDP1 and the second pad part PDP2 may be disposed while being spaced apart from each other to be physically and electrically separated from each other in the pad area PDA. For example, the first pad part PDP1 may be located adjacent to an edge of the substrate SUB in the pad area PDA, and the second pad part PDP2 may be located in the middle in the pad area PDA. The first pad part PDP1 may be located at both sides of the second pad part PDP2.

The line part LP may be located in the fan-out area FTA, and include the first line LP1 electrically connected to the first pad part PDP1 and the second line LP2 electrically connected to the second pad part PDP2. The first line LP1 and the second line LP2 may be disposed while being spaced apart from each other to be physically and electrically separated from each other in the fan-out area FTA. For example, the first line LP1 may be located adjacent to an edge of the substrate SUB in the fan-out are FTA, and the second line LP2 may be located in the middle in the fan-out area FTA. The first line LP1 may extend toward a first area DA1 in the fan-out area FTA, and the second line LP2 may extend toward a second area DA2 in the fan-out area FTA. The first line LP1 may be located at both sides of the second line LP2.

The first line LP1 may include first lines electrically connected to readout line RX1 to RX4 and RXk+3 to RXk+5 located in the first area DA1 through a first contact part CNT1. The first lines may include a 1ath line LP1$a$, a 1cth line LP1$c$, a 1eth line LP1$e$, a 1gth line LP1$g$, a 1hth line LP1$h$, a 1jth line LP1$j$, and a 1lth line LP1$l$.

In an embodiment, the first line LP1 may include other first lines electrically connected to a connection line CNL extending from the first area DA1 to the second area DA2 through a first contact part CNT1. The other first lines may include a 1bth line LP1$b$, a 1dth line LP1$d$, a 1fth line LP1$f$, a 1ith line LP1$i$, a 1kth line LP1$k$, and a 1mth line LP1$m$.

The second line LP2 may include second lines electrically connected to a data line D4 to Dk+2 located in the second area DA2 through a second contact part CNT2. The second lines may include a 2bth line LP2$b$, a 2dth line LP2$d$, a 2fth line LP2$f$, a 2hth line LP2$h$, a 2jth line LP2$j$, and a 2lth line LP2$l$.

In an embodiment, the second line LP2 may include other second lines electrically connected to a bridge line BRL extending from the second area DA2 to the first area DA1 through a second contact part CNT2. The other second lines may include a 2ath line LP2$a$, a 2cth line LP2$c$, a 2eth line LP2$e$, a 2gth line LP2$g$, a 2ith line LP2$i$, a 2kth line LP2$k$, and a 2mth line LP2$m$.

In the following embodiment, in case that at least one of the 1ath to 1mth lines LP1$a$ to LP1$m$ is arbitrarily designated or in case that the 1ath to 1mth lines LP1$a$ to LP1$m$ are inclusively designated, each of the 1ath to 1mth lines LP1$a$ to LP1$m$ or the 1ath to 1mth lines LP1$a$ to LP1$m$ will be referred to as a "first line LP1" or "first lines LP1." In case that at least one of the 2ath to 2mth lines LP2$a$ to LP2$m$ is arbitrarily designated or in case that the 2ath to 2mth lines LP2$a$ to LP2$m$ are inclusively designated, each of the 2ath to 2mth lines LP2$a$ to LP2$m$ or the 2ath to 2mth lines LP2$a$ to LP2$m$ will be referred to as a "second line LP2" or "second lines LP2."

The substrate SUB may include a display area DA and a non-display area NDA. The display area DA may include the first area DA1 and the second area DA2.

Signal lines to which various signals are applied may be disposed in the first area DA1 and the second area DA2. For example, data lines D1 to Dk+6 to which a data signal for adjusting brightness in each sub-pixel PXL is applied may be disposed in the first area DA1 and the second area DA2. Readout lines RX1 to RXk+5 receiving a sensing signal from the photo sensing pixel PSR may be disposed in the first area DA1 and the second area DA2. Various signal lines including a power line, a scan line, and the like in addition to the data lines D1 to Dk_6 and the readout lines RX1 to RXk+5 may be disposed in the first area DA1 and the second area DA2.

In the first area DA1 and the second area DA2, the sub-pixels PXL may be disposed or located in areas (e.g., pixel areas) partitioned by scan lines (e.g., "S1$i$ to S4$i$" shown in FIG. 4) and data lines (e.g., D1 to Dk+6). In the first area DA1 and the second area DA2, the photo sensing pixels PSR may be disposed or located in areas partitioned by the scan lines (e.g., S1$i$ to S4$i$) and readout lines (e.g., RX1 to RXk+5).

A first data line D1, a second data line D2, a third data line D3, a (k+3)th data line Dk+3, a (k+4)th data line Dk+4, a (k+5)th data line Dk+5, and a (k+6)th data line Dk+6 may be disposed in the first area DA1. For convenience of description, it is illustrated that seven data lines are disposed in the first area DA1. However, the present disclosure is not limited thereto.

A fourth data line D4, a fifth data line D5, a sixth data line D6, a kth data line Dk, a (k+1)th data line Dk+1, and a (k+2)th data line Dk+2 may be disposed in the second area DA2. For convenience of description, it is illustrated that six data lines are disposed in the second area DA2. However, the present disclosure is not limited thereto.

A first readout line RX1, a second readout line RX2, a third readout line RX3, a fourth readout line RX4, a (k+3)th readout line RXk+3, a (k+4)th readout line RXk+4, and a (k+5)th readout line RXk+5 may be disposed in the first area DA1. For convenience of description, it is illustrated that seven readout lines are disposed in the first area DA1. However, the present disclosure is not limited thereto.

A fifth readout line RX5, a sixth readout line RX6, a seventh readout line RX7, a kth readout line RXk, a (k+1)th readout line RXk+1, and a (k+2)th readout line RXk+2 may be disposed in the second area DA2. For convenience of description, it is illustrated that six readout lines are disposed in the second area DA2. However, the present disclosure is not limited thereto.

A connection line CNL and a bridge line BRL may be disposed in the display area DA. In an embodiment, the connection line CNL and the bridge line BRL may be disposed in the display area DA not to overlap with each other. A coupling cap, which may occur when the connection line CNL and the bridge line BRL overlap with each other, can be prevented.

In an embodiment, the connection line CNL may extend from the first area DA1 to the second area DA2. For example, the connection line CNL may be disposed across a border between the first area DA1 and the second area DA2 and extend from an edge of the display area DA to a middle (or inside) of the display area DA. The connection line CNL may be electrically connected to a corresponding first line LP1 through a first contact part CNT1. The connection line CNL may include a vertical connection line which is disposed in the first area DA1 and extends in a second direction DR2 and a horizontal connection line which is electrically connected to the vertical connection line and extending along a first direction DR1 to cross the border between the first area DA1 and the second area DA2.

The connection line CNL may include a first connection line CNL1, a second connection line CNL2, a third connection line CNL3, a fourth connection line CNL4, a fifth connection line CNL5, and a sixth connection line CNL6. Each of the first, second, third, fourth, fifth, and sixth connection lines CNL1, CNL2, CNL3, CNL4, CNL5, and CNL6 may include a vertical connection line which is located in the first area DA1 and extends in the second direction DR2 and a horizontal connection line which extends in the first direction DR1 and crosses the border between the first area DA1 and the second area DA2.

A vertical connection line of the first connection line CNL1 may be electrically connected to the 1bth line LP1$b$ through a first contact part CNT1 and be electrically connected to a horizontal connection line of the first connection line CNL1 through a third contact hole CH3. The horizontal connection line may be electrically connected to the seventh readout line RX7 disposed in the second area DA2 through a fourth contact hole CH4. The first connection line CNL1 may electrically connect the seventh readout line RX7 and the 1bth line LP1$b$ to each other. Accordingly, a sensing signal from the photo sensing pixel PSR of the second area DA2, which is received from the seventh readout line RX7, may be transferred to the driver DIC via the 1bth line LP1$b$ through the first connection line CNL1.

A vertical connection line of the second connection line CNL2 may be electrically connected to the 1dth line LP1$d$ through a first contact part CNT1, and be electrically connected to a horizontal connection line of the second connection line CNL2 through a third contact hole CH3. The horizontal connection line may be electrically connected to the sixth readout line RX6 disposed in the second area DA2 through a fourth contact hole CH4. The second connection line CNL2 may electrically connect the sixth readout line RX6 and the 1dth line LP1$d$ to each other. Accordingly, a sensing signal from the photo sensing pixel PSR of the second area DA2, which is received from the sixth readout line RX6, may be transferred to the driver DIC via the 1dth line LP1$d$ through the second connection line CNL2.

A vertical connection line of the third connection line CNL3 may be electrically connected to the 1fth line LP1$f$ through a first contact part CNT1, and be electrically connected to a horizontal connection line of the third connection line CNL3 through a third contact hole CH3. The horizontal connection line may be electrically connected to the fifth readout line RX5 disposed in the second area DA2 through a fourth contact hole CH4. The third connection line CNL3 may electrically connect the fifth readout line RX5 and the 1fth line LP1$f$ to each other. Accordingly, a sensing signal from the photo sensing pixel PSR of the second area DA2, which is received from the fifth readout line RX5, may be transferred to the driver DIC via the 1fth line LP1$f$ through the third connection line CNL3.

A vertical connection line of the fourth connection line CNL4 may be electrically connected to the 1mth line LP1$m$ through a first contact part CNT1, and be electrically connected to a horizontal connection line of the fourth connection line CNL4 through a third contact hole CH3. The horizontal connection line may be electrically connected to the kth readout line RXk disposed in the second area DA2 through a fourth contact hole CH4. The fourth connection line CNL4 may electrically connect the kth readout line RXk and the 1mth line LP1$m$ to each other. Accordingly, a sensing signal from the photo sensing pixel PSR of the second area DA2, which is received from the kth readout line RXk, may be transferred to the driver DIC via the 1mth line LP1$m$ through the fourth connection line CNL4.

A vertical connection line of the fifth connection line CNL5 may be electrically connected to the 1kth line LP1$k$ through a first contact part CNT1, and be electrically connected to a horizontal connection line of the fifth connection line CNL5 through a third contact hole CH3. The horizontal connection line may be electrically connected to the (k+1)th readout line RXk+1 disposed in the second area DA2 through a fourth contact hole CH4. The fifth connection line CNL5 may electrically connect the (k+1)th readout line RXk+1 and the 1kth line LP1$k$ to each other. Accordingly, a sensing signal from the photo sensing pixel PSR of the second area DA2, which is received from the (k+1)th readout line RXk+1, may be transferred to the driver DIC via the 1kth line LP1$k$ through the fifth connection line CNL5.

A vertical connection line of the sixth connection line CNL6 may be electrically connected to the 1ith line LP1$i$ through a first contact hole CNT1, and be electrically connected to a horizontal connection line of the sixth connection line CNL6 through a third contact hole CH3. The horizontal connection line may be electrically connected to the (k+2)th readout line RXk+2 disposed in the second area DA2 through a fourth contact hole CH4. The sixth connection line CNL6 may electrically connect the (k+2)th readout line RXk+2 and the 1ith line LP1$i$ to each other. Accordingly, a sensing signal from the photo sensing pixel PSR of the second area DA2, which is received from the (k+2)th readout line RXk+2, may be transferred to the driver DIC via the 1ith line LP1$i$ through the sixth connection line CNL6.

One end of the vertical connection line may be electrically connected to a corresponding first line LP1 through a first contact part CNT1, and the other end of the vertical connection line may be electrically connected to a corresponding horizontal connection line through a third contact hole CH3. One end of the horizontal connection line may be electrically connected to the vertical connection line through a third contact hole CH3, and the other end of the horizontal connection line may be electrically connected to a corresponding readout line located in the second area DA2 through a fourth contact hole CH4.

In an embodiment, the bridge line BRL may extend from the second area DA2 to the first area DA1. For example, the bridge line BRL may be disposed across a border between the first area DA1 and the second area DA2 and extend from a middle (or inside) of the display area DA to an edge of the display area DA. The bridge line BRL may be electrically connected to a corresponding second line LP2 through a second contact part CNT2. The bridge line BRL may include a vertical bridge line which is disposed in the second area DA2 and extends in the second direction DR2 and a horizontal bridge line which is electrically connected to the vertical bridge line and extending along the first direction DR1 to cross the border between the first area DA1 and the second area DA2.

The bridge line BRL may include a first bridge line BRL1, a second bridge line BRL2, a third bridge line BRL3, a fourth bridge line BRL4, a fifth bridge line BRL5, a sixth bridge line BRL6, and a seventh bridge line BRL7. Each of the first, second, third, fourth, fifth, sixth, and seventh bridge lines BRL1, BRL2, BRL3, BRL4, BRL5, BRL6, and BRL7 may include a vertical bridge line which is located in the second area DA2 and extends in the second direction DR2 and a horizontal bridge line which extends in the first direction DR1 and crosses the border between the first area DA1 and the second area DA2.

A vertical bridge line of the first bridge line BRL1 may be electrically connected to the 2eth line LP2e through a second contact part CNT2, and be electrically connected to a horizontal bridge line of the first bridge line BRL1 through a first contact hole CH1. The horizontal bridge line may be electrically connected to the first data line D1 disposed in the first area DA1 through a second contact hole CH2. The first bridge line BRL1 may electrically connect the first data line D1 and the 2eth line LP2e to each other. Accordingly, a data signal transferred from the driver DIC to the 2eth line LP2e may be transferred to the first data line D1 via the first bridge line BRL1.

A vertical bridge line of the second bridge line BRL2 may be electrically connected to the 2cth line LP2c through a second contact part CNT2, and be electrically connected to a horizontal bridge line of the second bridge line BRL2 through a first contact hole CH1. The horizontal bridge line may be electrically connected to the second data line D2 disposed in the first area DA1 through a second contact hole CH2. The second bridge line BRL2 may electrically connect the second data line D2 and the 2cth line LP2c to each other. Accordingly, a data signal transferred from the driver DIC to the 2cth line LP2c may be transferred to the second data line D2 via the second bridge line BRL2.

A vertical bridge line of the third bridge line BRL3 may be electrically connected to the 2ath line LP2a through a second contact part CNT2, and be electrically connected to a horizontal bridge line of the third bridge line BRL3 through a first contact hole CH1. The horizontal bridge line may be electrically connected to the third data line D3 disposed in the first area DA1 through a second contact hole CH2. The third bridge line BRL3 may electrically connect the third data line D3 and the 2ath line LP2a to each other. Accordingly, a data signal transferred from the driver DIC to the 2ath line LP2a may be transferred to the third data line D3 via the third bridge line BRL3.

A vertical bridge line of the fourth bridge line BRL4 may be electrically connected to the 2gth line LP2g through a second contact part CNT2, and be connected to a horizontal bridge line of the fourth bridge line BRL4 through a first contact hole CH1. The horizontal bridge line may be electrically connected to the (k+6)th data line Dk+6 disposed in the first area DA1 through a second contact hole CH2. The fourth bridge line BRL4 may electrically connect the (k+6)th data line Dk+6 and the 2gth line LP2g to each other. Accordingly, a data signal transferred from the driver DIC to the 2gth line LP2g may be transferred to the (k+6)th data line Dk+6 via the fourth bridge line BRL4.

A vertical bridge line of the fifth bridge line BRL5 may be electrically connected to the 2ith line LP2i through a second contact part CNT2, and be electrically connected to a horizontal bridge line of the fifth bridge line BRL5 through a first contact hole CH1. The horizontal bridge line may be electrically connected to the (k+5)th data line Dk+5 disposed in the first area DA1 through a second contact hole CH2. The fifth bridge line BRL5 may electrically connect the (k+5)th data line Dk+5 and the 2ith line LP2i to each other. Accordingly, a data signal transferred from the driver DIC to the 2ith line LP2i may be transferred to the (k+5)th data line Dk+5 via the fifth bridge line BRL5.

A vertical bridge line of the sixth bridge line BRL6 may be electrically connected to the 2kth line LP2k through a second contact part CNLT, and be electrically connected to a horizontal bridge line of the sixth bridge line BRL6 through a first contact hole CH1. The horizontal bridge line may be electrically connected to the (k+4)th data line Dk+4 disposed in the first area DA1 through a second contact hole CH2. The sixth bridge line BRL6 may electrically connect the (k+4)th data line Dk+4 and the 2kth line LP2k to each other. Accordingly, a data signal transferred from the driver DIC to the 2kth line LP2k may be transferred to the (k+4)th data line Dk+4 via the sixth bridge line BRL6.

A vertical bridge line of the seventh bridge line BRL7 may be electrically connected to the 2mth line LP2m through a second contact part CNT2, and be electrically connected to a horizontal bridge line of the seventh bridge line BRL7 through a first contact hole CH1. The horizontal bridge line may be electrically connected to the (k+3)th data line Dk+3 disposed in the first area DA1 through a second contact hole CH2. The seventh bridge line BRL7 may electrically connect the (k+3)th data line Dk+3 and the 2mth line LP2m to each other. Accordingly, a data signal transferred from the driver DIC to the 2mth line LP2m may be transferred to the (k+3)th data line Dk+3 via the seventh bridge line BRL7.

In accordance with the above-described embodiment, the first pads P1 electrically connected to a readout line may be disposed at least one predetermined area to be disposed adjacent to one another without any intervening second pad and the second pads P2 electrically connected to a data line may be disposed in at least one predetermined area to be disposed adjacent to one another without any intervening first pad. For example, the second pad part PDP2 may be located in the middle of the pad area PDA to correspond to the second area DA2 of the display area DA, and the first pad part PDP1 may be located at both edges of the pad area PDA to correspond to the first area DA1 of the display area DA. Interference between a sensing signal of the photo sensing pixel PSR which is transferred to the driver DIC through the first pad part PDP1 and a data signal transferred to a data line D via the second pad part PDP2 may be reduced or prevented. Also, interference between a data signal transferred to a data line via the second pad part PDP2 and a sensing signal of the photo sensing pixel PSR, which is transferred to the driver DIC through the first pad part PDP1 may be reduced or prevented. In case that a readout pad electrically connected to a readout line and a data pad electrically connected to a data line are alternately disposed in the pad area PDA, a coupling cap (or parasitic capacitance) may occur between the readout pad and the data pad. Accordingly, in the above-described embodiment, the first pad part PDP1 and the second pad part PDP2 are disposed to be spaced apart from each other, and each is located in a specific area of the pad area PDA, so that the above-described coupling cap can be prevented, thereby improving the reliability of the display device DD.

In accordance with the above-described embodiment, the first line LP1 electrically connected to a readout line may be disposed adjacent one another in at least one predetermined area without any intervening second line LP2 in the fanout area FTA and the second line LP2 electrically connected to a data line may be disposed adjacent one another in at least one predetermined area without any intervening first line LP1 in the fanout area FTA. For example, the second line LP2 may be located in the middle of the fan-out area FTA to correspond to the second area DA2 of the display area DA, and the first line LP1 may be located at both edges of the fan-out are FTA to correspond to the first area DA1 of the display area DA. Interference between a sensing signal of the photo sensing pixel PSR which is transferred to the first pad part PDP1 through the first line LP1 and a data signal transferred to a data line via the second line LP2 may be reduced or prevented. Also, interference between a data signal transferred to a data line via the second line LP2 and a sensing signal of the photo sensing pixel PSR which is transferred to the first pad part PDP1 through the first line LP1 may be reduced or prevented. In case that a readout fan-out line electrically connected to a data fan-out line and a data pad electrically connected to a data line are alternately disposed in the fan-out area FTA, a coupling cap (or parasitic capacitance) may occur between the readout fan-out line and the data fan-out line. Accordingly, in the above-described embodiment, the first line LP1 and the second line LP2 are disposed to be spaced apart from or not to be alternating each other, and each is located in at least one predetermined area of the fan-out area FTA, so that the above-described coupling cap can be prevented, thereby improving the reliability of the display device DD.

Hereinafter, the connection line CNL electrically connected to the first line LP1 and the bridge line BRL electrically connected to the second line LP2 will be described in detail with reference to FIGS. 8 to 13.

Figure 8:
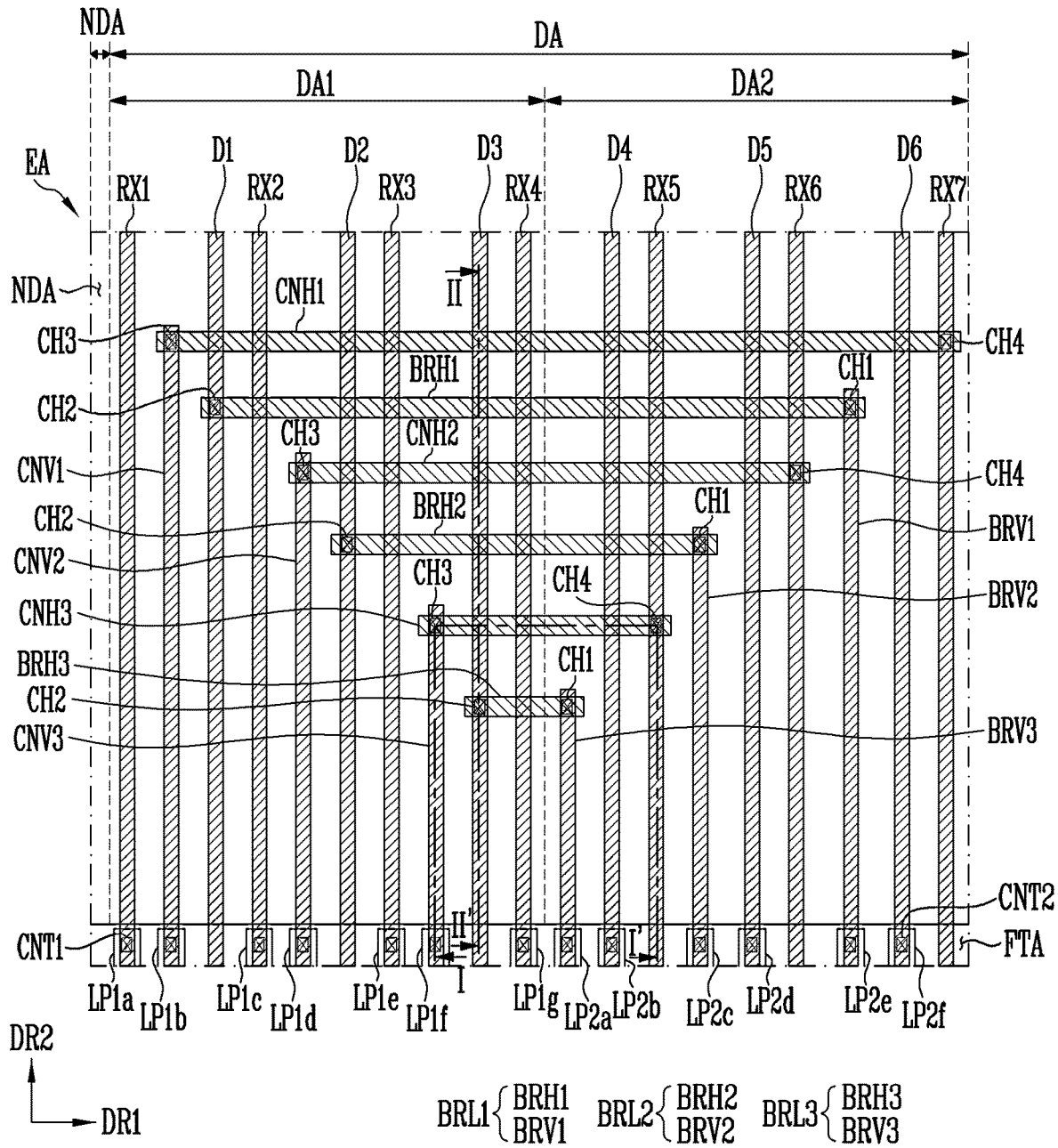
FIG. 8 is a schematic enlarged view illustrating portion EA shown in FIG. 7.
Figure 9:
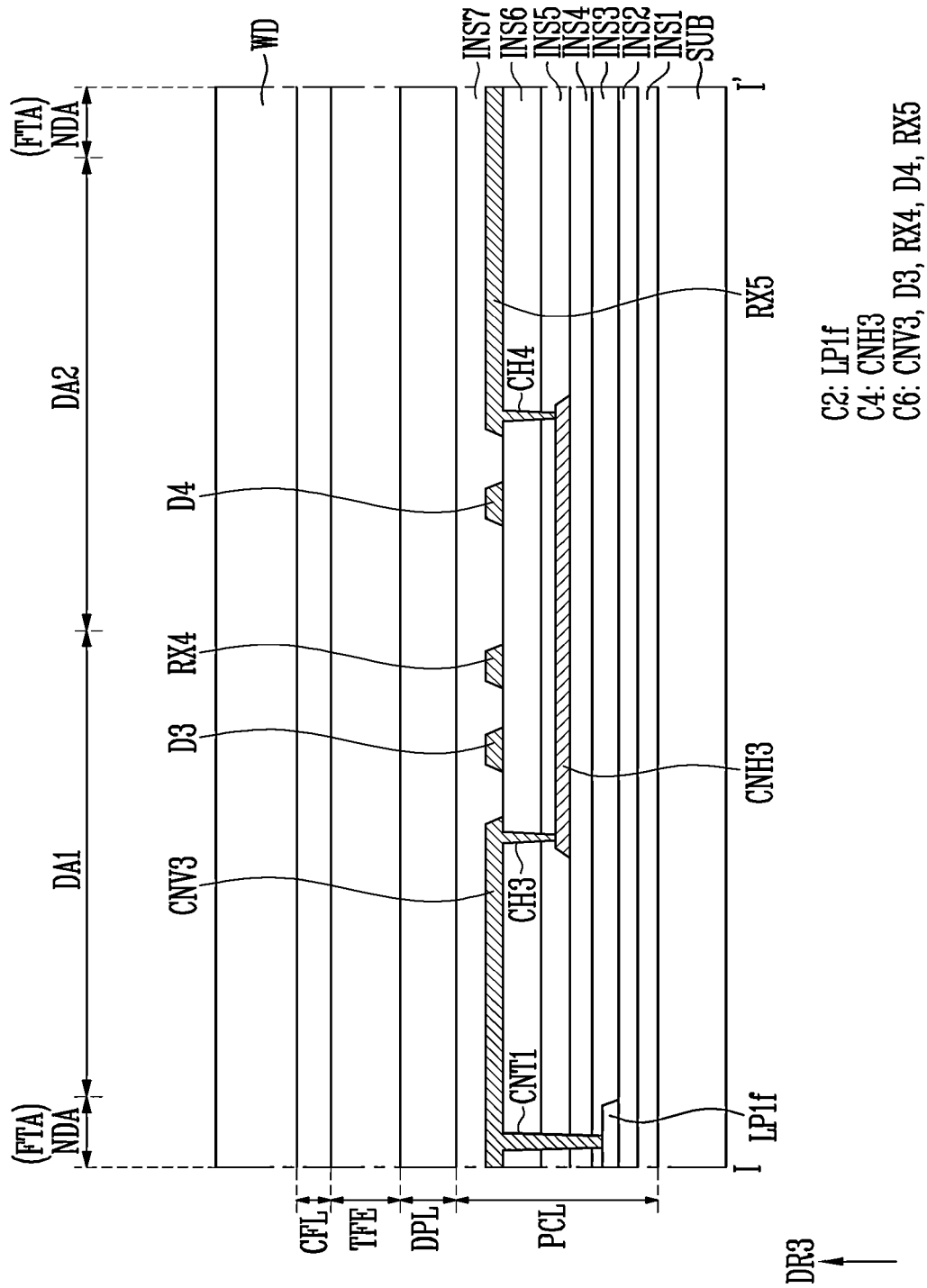
FIGS. 9, 10 and 11 are schematic cross-sectional views taken along line I-I' shown in FIG. 8.
Figure 10:
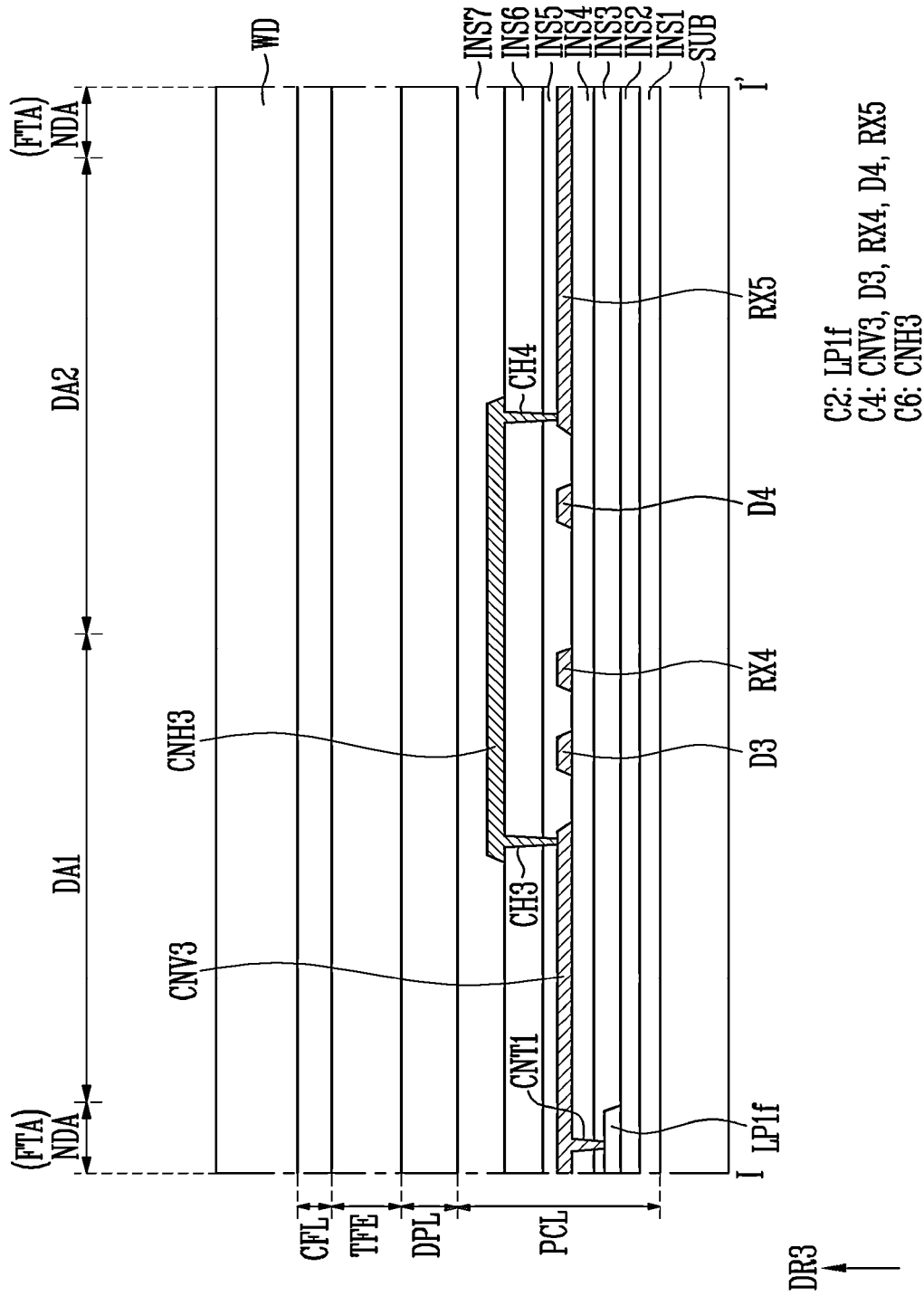
Figure 11:
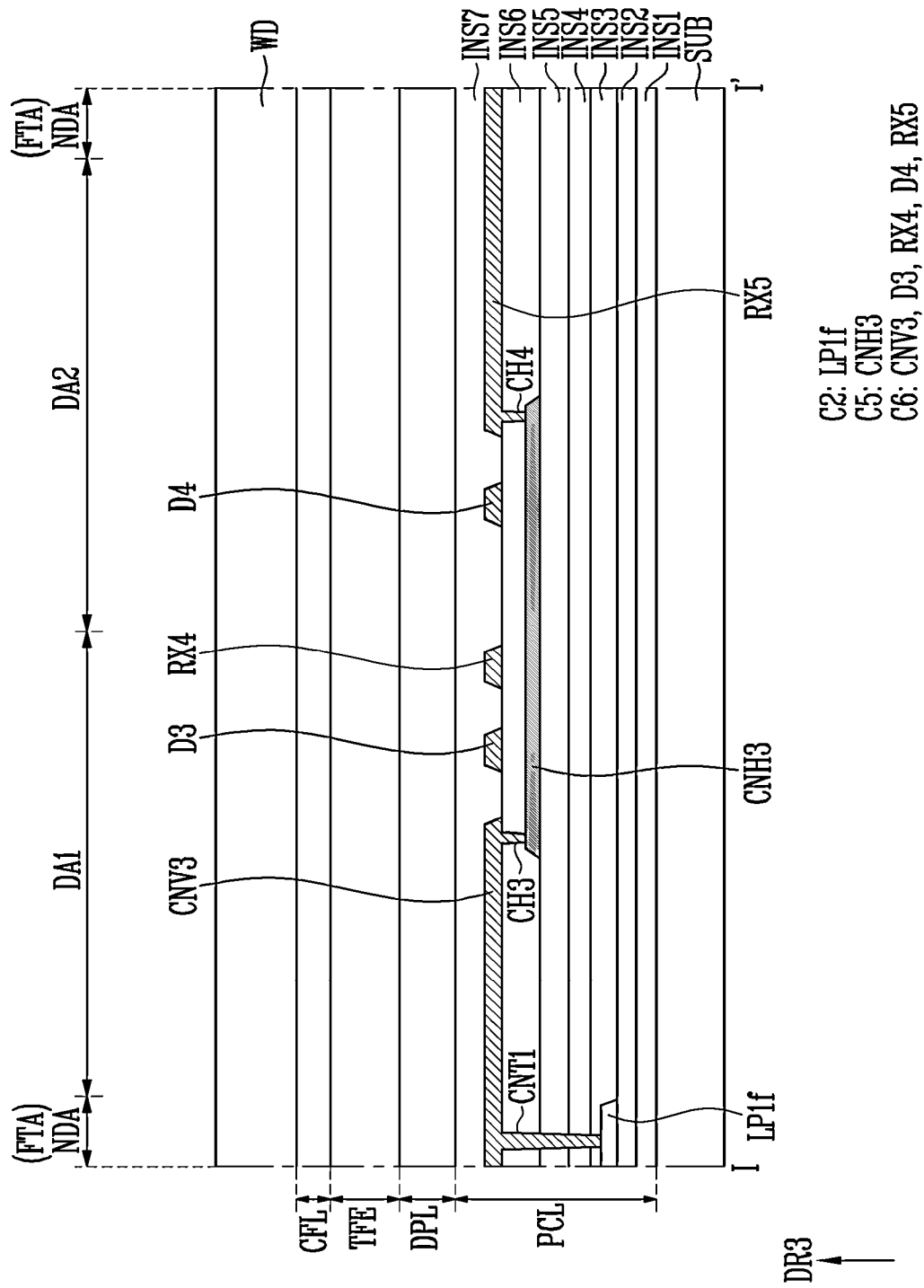
Figure 12:
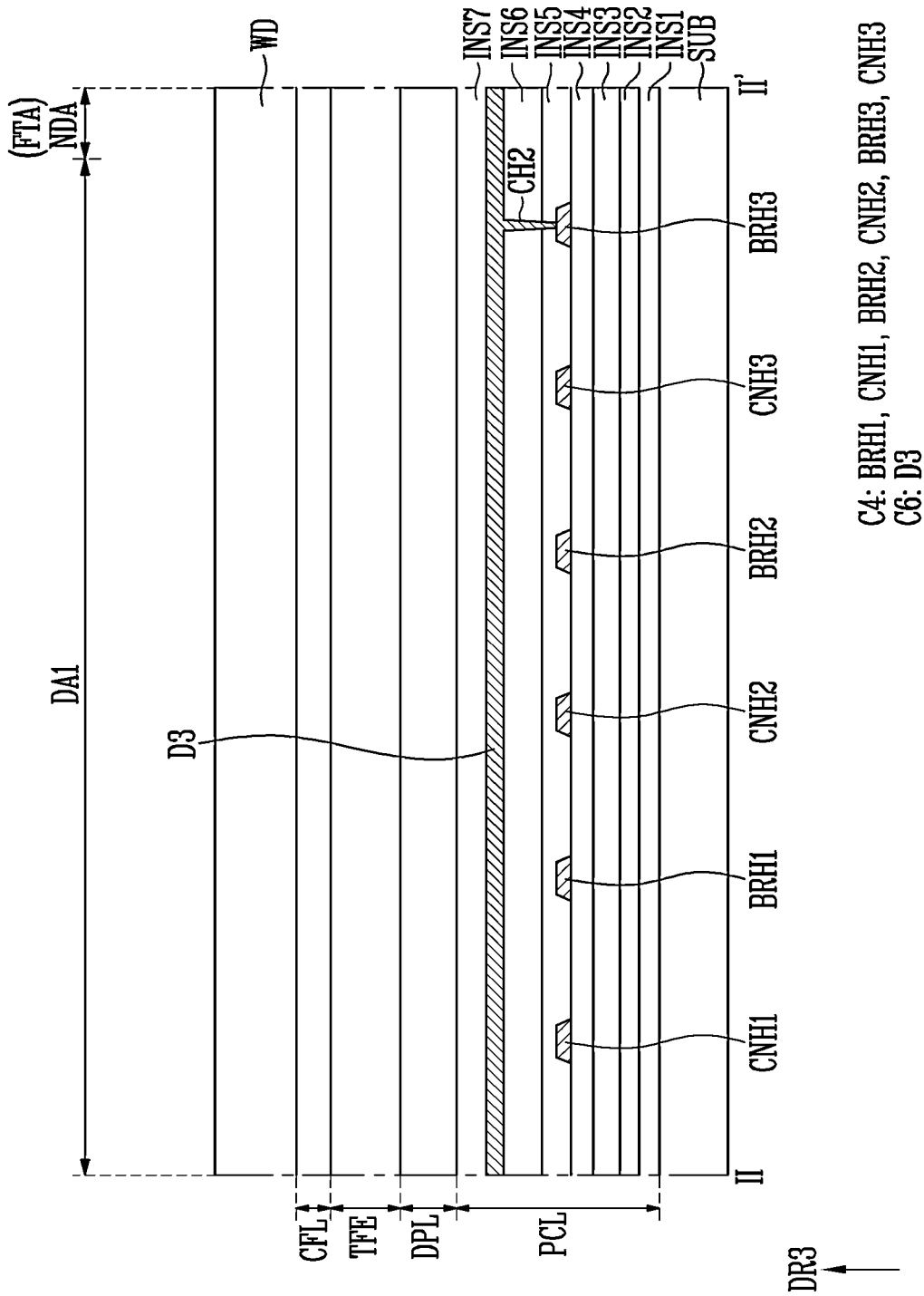
FIGS. 12 and 13 are schematic cross-sectional views taken along line II-II' shown in FIG. 8.
Figure 13:
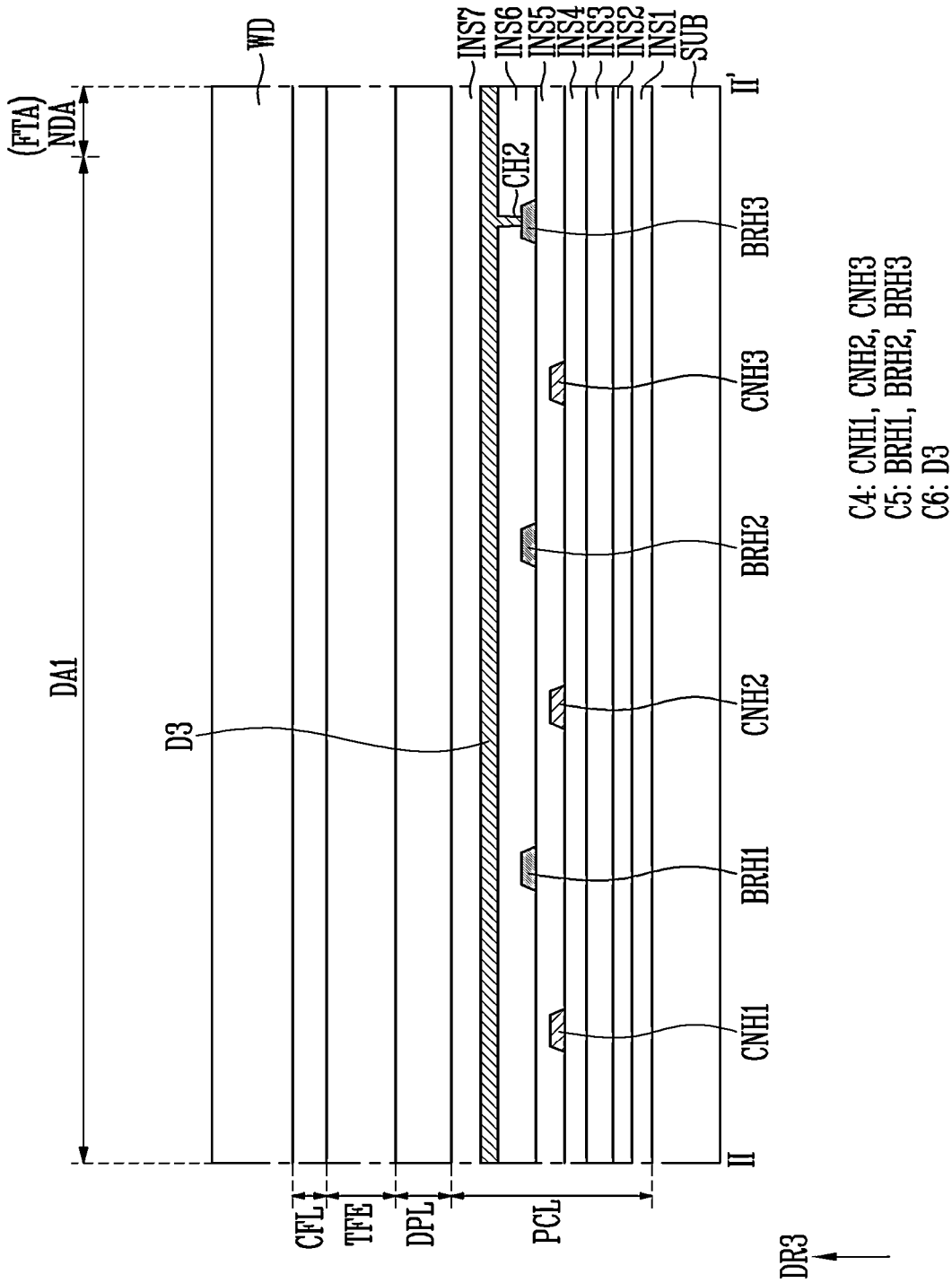

FIG. 8 is a schematic enlarged view illustrating portion EA shown in FIG. 7. FIGS. 9 to 11 are schematic cross-sectional views taken along line I-I' shown in FIG. 8. FIGS. 12 and 13 are schematic cross-sectional views taken along line II-II' shown in FIG. 8.

Each of FIGS. 10 and 11 illustrates a modification of FIG. 9 in relation to positions of a third horizontal connection line CNH3, a third vertical connection line CNV3, and the fifth readout line RX5, and the like.

FIG. 13 illustrates a modification of FIG. 12 in relation to positions of first to third horizontal bridge lines BRH1, BRH2, and BRH3, and the like.

In relation to embodiments shown in FIGS. 8 to 13, portions different from those of the above-described embodiment will be mainly described to avoid redundancy.

Referring to FIGS. 1 to 13, the first to third connection lines CNL1, CNL2, and CNL3 may extend from the first area DA1 to the second area DA2. The first to third bridge lines BRL1, BRL2, and BRL3 may extend from the second area DA2 to the first area DA1. Each of the first to third connection lines CNL1, CNL2, and CNL3 may have a shape bent at least once to be electrically connected to a readout line disposed in the second area DA2. Each of the first to third bridge lines BRL1, BRL2, and BRL3 may have a shape bent at least once to be electrically connected to a data line disposed in the first area DA1. In an embodiment, each of the first to third connection lines CNL1, CNL2, and CNL3 may not overlap with each of the first to third bridge lines BRL1, BRL2, and BRL3.

The first connection line CNL1 may include a first vertical connection line CNV1 which is disposed in the first area DA1 and extends in the second direction DR2 and a first horizontal connection line CNH1 which is located while traversing the second area DA2 from the first area DA1 and extends in the first direction DR1. One end of the first horizontal connection line CNH1 may be located in the first area DA1 and the other end of the first horizontal connection line CNH1 may be located in the second area DA2.

One end of the first vertical connection line CNV1 may be electrically connected to the 1bth line LP1*b* through a first contact part CNT1. The other end of the first vertical connection line CNV1 may be electrically connected to the first horizontal connection line CNH1 through a third contact hole CH3. The first contact part CNT1 may be formed by removing portions of insulating layers located between the first vertical connection line CNV1 and the 1bth line LP1*b*. The third contact hole CH3 may be formed by removing portions of insulating layers located between the first vertical connection line CNV1 and the first horizontal connection line CNH1.

The one end of the first horizontal connection line CNH1 may be electrically connected to the first vertical connection line CNV1 through the third contact hole CH3. The other end of the first horizontal connection line CNH1 may be electrically connected to the seventh readout line RX7 disposed in the second area DA2 through a fourth contact hole CH4. The fourth contact hole CH4 may be formed by removing portions of insulating layers located between the first horizontal connection line CNH1 and the seventh readout line RX7.

The second connection line CNL2 may include a second vertical connection line CNV2 which is disposed in the first area DA1 and extends in the second direction DR2 and a second horizontal connection line CNH2 which is located while traversing the second area DA2 from the first area DA1 and extends in the first direction DR1. One end of the second horizontal connection line CNH2 may be located in the first area DA1, and the other end of the second horizontal connection line CNH2 may be located in the second area DA2.

One end of the second vertical connection line CNV2 may be electrically connected to the 1dth line LP1*d* through a first contact part CNT1. The other end of the second vertical connection line CNV2 may be electrically connected to the second horizontal connection line CNH2 through a third contact hole CH3. The first contact part CNT1 may be formed by removing portions of insulating layers located between the second vertical connection line CNV2 and the 1dth line LP1*d*. The third contact hole CH3 may be formed by removing portions of insulating layers located between the second vertical connection line CNV2 and the second horizontal connection line CNH2.

The one end of the second horizontal connection line CNH2 may be electrically connected to the second vertical connection line CNV2 through the third contact hole CH3. The other end of the second horizontal connection line CNH2 may be electrically connected to the sixth readout line RX6 disposed in the second area DA2 through a fourth contact hole CH4. The fourth contact hole CH4 may be formed by removing portions of insulating layers located between the second horizontal connection line CNH2 and the sixth readout line RX6.

The third connection line CNL3 may include a third vertical connection line CNV3 which is disposed in the first area DA1 and extends in the second direction DR2 and a third horizontal connection line CNH3 which is located while traversing the second area DA2 from the first area DA1 and extends in the first direction DR1. One end of the third horizontal connection line CNH3 may be located in the first area DA1, and the other end of the third horizontal connection line CNH3 may be located in the second area DA2.

One end of the third vertical connection line CNV3 may be electrically connected to the 1fth line LP1*f* through a first contact part CNT1. The other end of the third vertical connection line CNV3 may be electrically connected to the third horizontal connection line CNH3 through a third contact hole CH3. The first contact part CNT1 may be formed by removing portions of insulating layers located between the third vertical connection line CNV3 and the 1fth line LP1f. The third contact hole CH3 may be formed by removing portions of insulating layers located between the third vertical connection line CNV3 and the third horizontal connection line CNH3.

The one end of the third horizontal connection line CNH3 may be electrically connected to the third vertical connection line CNV3 through the third contact hole CH3. The other end of the third horizontal connection line CNH3 may be electrically connected to the fifth readout line RX5 disposed in the second area DA2 through a fourth contact hole CH4. The fourth contact hole CH4 may be formed by removing portions of insulating layers located between the third horizontal connection line CNH3 and the fifth readout line RX5.

The first bridge line BRL1 may include a first vertical bridge line BRV1 which is disposed in the second area DA2 and extends in the second direction DR2 and a first horizontal bridge line BRH1 which is located while traversing the first area DA1 from the second area DA2 and extends in the first direction DR1. One end of the first horizontal bridge line BRH1 may be located in the second area DA2, and the other end of the first horizontal bridge line BRH1 may be located in the first area DA1.

One end of the first vertical bridge line BRV1 may be electrically connected to the 2eth line LP2e through a second contact part CNT2. The other end of the first vertical bridge line BRV1 may be electrically connected to the first horizontal bridge line BRH1 through a first contact hole CH1. The second contact part CNT2 may be formed by removing portion of insulating layers located between the first vertical bridge line BRV1 and the 2eth line LP2e. The first contact hole CH1 may be formed by removing portions of insulating layers located between the first vertical bridge line BRV1 and the first horizontal bridge line BRH1.

The one end of the first horizontal bridge line BRH1 may be electrically connected to the first vertical bridge line BRV1 through the first contact hole CH1. The other end of the first horizontal bridge line BRH1 may be electrically connected to the first data line D1 located in the first area DA1 through a second contact hole CH2. The second contact hole CH2 may be formed by removing portions of insulating layers located between the first horizontal bridge line BRH1 and the first data line D1.

The second bridge line BR2 may include a second vertical bridge line BRV2 which is disposed in the second area DA2 and extends in the second direction DR2 and a second horizontal bridge line BRH2 which is located while traversing the first area DA1 from the second area DA2 and extends in the first direction DR1. One end of the second horizontal bridge line BRH2 may be located in the second area DA2, and the other end of the second horizontal bridge line BRH2 may be located in the first area DA1. One end of the second vertical bridge line BRV2 may be electrically connected to the 2cth line LP2c through a second contact part CNT2. The other end of the second vertical bridge line BRV2 may be electrically connected to the second horizontal bridge line BRH2 through a first contact hole CH1. The second contact part CNT2 may be formed by removing portions of insulating layers located between the second vertical bridge line BRv2 and the 2cth line LP2c. The first contact hole CH1 may be formed by removing portions of insulating layers located between the second vertical bridge line BRV2 and the second horizontal bridge line BRH2.

The one end of the second horizontal bridge line BRH2 may be electrically connected to the second vertical bridge line BRV2 through the first contact hole CH1. The other end of the second horizontal bridge line BRH2 may be electrically connected to the second data line D2 located in the first area DA1 through a second contact hole CH2. The second contact hole CH2 may be formed by removing portions of insulating layers located between the second horizontal bridge line BRH2 and the second data line D2.

The third bridge line BRL3 may include a third vertical bridge line BRV3 which is disposed in the second area DA2 and extends in the second direction DR2 and a third horizontal bridge line BRH3 which is located while traversing the first area DA1 from the second area DA2 and extends in the first direction DR1. One end of the third horizontal bridge line BRH3 may be located in the second area DA2, and the other end of the third horizontal bridge line BRH3 may be located in the first area DA1.

One end of the third vertical bridge line BRV3 may be electrically connected to the 2ath line LP2a through a second contact part CNT2. The other end of the third vertical bridge line BRV3 may be electrically connected to the third horizontal bridge line BRH3 through a first contact hole CH1. The second contact part CNT2 may be formed by removing portion of insulating layers located between the third vertical bridge line BRV3 and the 2ath line LP2a. The first contact hole CH1 may be formed by removing portions of insulating layers located between the third vertical bridge line BRV3 and the third horizontal bridge line BRH3.

The one end of the third horizontal bridge line BRH3 may be electrically connected to the third vertical bridge line BRV3 through the first contact hole CH1. The other end of the third horizontal bridge line BRH3 may be electrically connected to the third data line D3 located in the first area DA1 through a second contact hole CH2. The second contact hole CH2 may be formed by removing portions of insulating layers located between the third horizontal bridge line BRH3 and the third data line D3.

Each of the readout lines located in the first area DA1 may be directly connected to a corresponding first line LP1. For example, the first readout line RX1 located in the first area DA1 may be electrically connected to the 1ath line LP1a through a first contact part CNT1. The second readout line RX2 located in the first area DA1 may be electrically connected to the 1cth line LP1c through a first contact part CNT1. The third readout line RX3 located in the first area DA1 may be electrically connected to the 1eth line LP1e through a first contact part CNT1. The fourth readout line RX4 located in the first area DA1 may be electrically connected to the 1gth line LP1g through a first contact part CNT1.

Each of the data lines located in the second area DA2 may be directly connected to a corresponding second line LP2. For example, the fourth data line D4 located in the second area DA2 may be electrically connected to the 2bth line LP2b through a second contact part CNT2. The fifth data line D5 located in the second area DA2 may be electrically connected to the 2dth line LP2d through a second contact part CNT2. The sixth data line D6 located in the second area DA2 may be electrically connected to the 2f line LP2f through a second contact part CNT2.

In an embodiment, lines extending in the first direction DR1 and lines extending in the second direction DR2 may be disposed in different layers. For example, horizontal connection lines and horizontal bridge lines, which extend in the first direction DR1, may be disposed on the fourth insulating layer INS4. Vertical connection lines, vertical bridge lines, readout lines, and data lines, which extend in the second direction DR2, may be disposed on the sixth insulating layer INS6. In other words, the horizontal connection lines and the horizontal bridge lines may be configured as the fourth conductive layer C4, and the vertical connection lines, the vertical bridge lines, the readout lines, and the data lines may be configured as the sixth conductive layer C6. However, the present disclosure is not limited thereto. In some embodiments, the horizontal connection lines and the horizontal bridge lines may be configured as the fifth conductive layer C5 or the sixth conductive layer C6, and the vertical connection lines, the vertical bridge lines, the readout lines, and the data lines may be configured as the fourth conductive layer C4 or the fifth conductive layer C5.

In an embodiment, horizontal connection lines and horizontal bridge lines, which extend in the first direction DR1, may be disposed in the same layer. For example, the first to third horizontal connection lines CNH1, CNH2, and CNH3 and the first to third horizontal bridge lines BRH1, BRH2, and BRH3 may be configured as the fourth conductive layer C4, and be formed through the same process to be disposed on the same layer, e.g., on the fourth insulating layer INS4. However, the present disclosure is not limited thereto. In some embodiments, the first to third horizontal connection lines CNH1, CNH2, and CNH3 and the first to third horizontal bridge lines BRH1, BRH2, and BRH3 may be disposed in different layers. For example, as shown in FIG. 13, the first to third horizontal connection lines CNH1, CNH2, and CNH3 may be configured as the fourth conductive layer C4 which is disposed on the fourth insulating layer INS4, and the first to third horizontal bridge lines BRH1, BRH2, and BRH3 may be configured as the fifth conductive layer C5 which is disposed on the fifth insulating layer INS5.

In an embodiment, vertical connection lines, vertical bridge lines, readout lines, and data lines, which extend in the second direction DR2, may be disposed in the same layer. For example, the first to third vertical connection lines CNV1, CNV2, and CNV3, the first to third vertical bridge lines BRV1, BRV2, and BRV3, the first to seventh readout lines RX1, RX2, RX3, RX4, RX5, RX6, and RX7, and the first to sixth data lines D1, D2, D3, D4, D5, and D6 may be configured as the sixth conductive layer C6, and be formed through the same process to be disposed on the same layer, e.g., on the sixth insulating layer INS6. The first to third horizontal connection lines CNH1, CNH2, and CNH3 and the first to third horizontal bridge lines BRH1, BRH2, and BRH3 may be configured as the fourth conductive layer C4 which is disposed on the fourth insulating layer INS4. For example, as shown in FIG. 12, the third data line D3 may be configured as the sixth conductive layer C6 which is disposed on the sixth insulating layer INS6, and be electrically connected to the third horizontal bridge line BRH3 through a second contact hole CH2 formed through the fifth and sixth insulating layers INS5 and INS6.

More specifically, referring to FIG. 9, the one end of the third horizontal connection line CNH3 may be electrically connected to the third vertical connection line CNV3 through a third contact hole formed through the fifth and sixth insulating layers INS5 and INS6. The other end of the third horizontal connection line CNH3 may be electrically connected to the fifth readout line RX5 through a fourth contact hole CH4 formed through the fifth and sixth insulating layers INS5 and INS6. The third vertical connection line CNV3 may be electrically connected to the 1fth line LP1f through a first contact part CNT1 formed through the third, fourth, fifth, and sixth insulating layers INS3, INS4, INS5, and INS6. The 1fth line LP1f may be configured as the second conductive layer C2 which is disposed on the second insulating layer INS2. In an embodiment, the first line LP1 including the 1fth line LP1f may be configured as the second conductive layer C2 or the third conductive layer C3. The second line LP2 may also be configured as the second conductive layer C2 or the third conductive layer C3.

In the above-described embodiment, it has been described that the third horizontal connection line CNH3 is configured as the fourth conductive layer C4. However, the present disclosure is not limited thereto. In some embodiments, as shown in FIG. 11, the third horizontal connection line CNH3 may be configured as the fifth conductive layer C5 to be disposed on the fifth insulating layer INS5. The one end of the third horizontal connection line CNH3 may be electrically connected to the third vertical connection line CNV3 configured as the sixth conductive layer C6 through a third contact hole CH formed through the sixth insulating layer INS6, and the other end of the third horizontal connection line CNH3 may be electrically connected to the fifth readout line RX5 configured as the sixth conductive layer C6 through a fourth contact hole CH4 formed through the sixth insulating layer INS6.

In some embodiments, the first to third vertical connection line CNV1, CNV2, and CNV3, the first to third vertical bridge lines BRV1, BRV2, and BRV3, the first to seventh readout lines RX1, RX2, RX3, RX4, RX5, RX6, and RX7, and the first to sixth data lines D1, D2, D3, D4, D5, and D6 may be configured as the fourth conductive layer C4, and be formed through the same process to be disposed on the fourth insulating layer INS4. For example, as shown in FIG. 10, the third vertical connection line CNV3 may be configured as the fourth conductive layer C4, and the third horizontal connection line CNH3 may be configured as the sixth conductive layer C6. The third data line D3, the fourth readout line RX4, the third vertical bridge line BRV3, the fourth data line D4, and the fifth readout line RX5, which are disposed adjacent to the third vertical connection line CNV3 in the first direction DR1, may be configured as the fourth conductive layer C4 which is disposed on the fourth insulating layer INS4. The third vertical connection line CNV3 may be electrically connected to the 1fth line LP1f through a first contact part CNT1 formed through the third and fourth insulating layers INS3 and INS4.

In accordance with the above-described embodiment, the connection line CNL and the bridge line BRL are disposed not to overlap with each other, so that the coupling cap which may occur as the connection line CNL and the bridge line BRL overlap with each other can be reduced or prevented, thereby improving the reliability of the display device DD.

Figure 14:
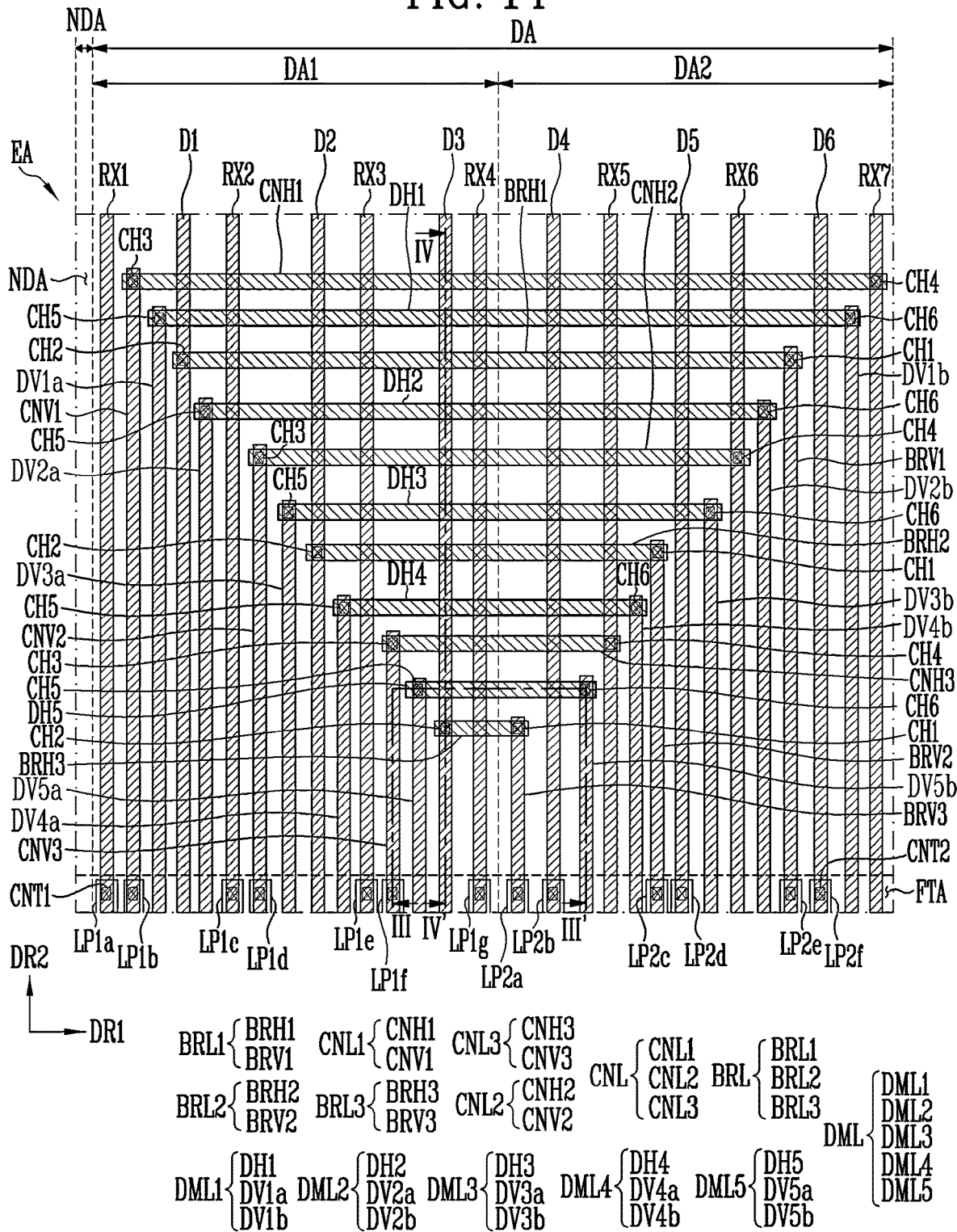
FIG. 14 is a schematic plan view illustrating a modification of FIG. 8.
Figure 15:
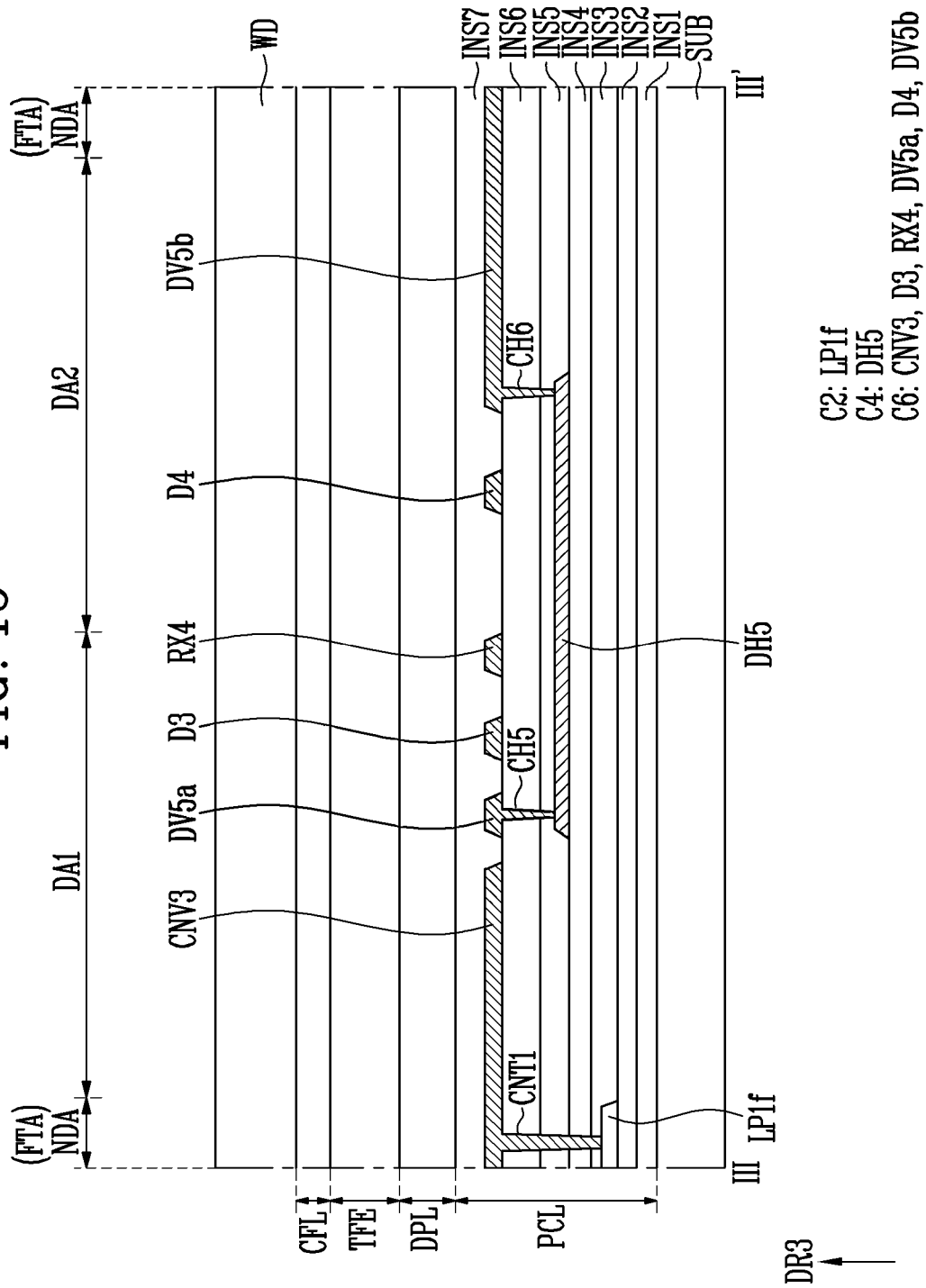
FIG. 15 is a schematic cross-sectional view taken along line III-III' shown in FIG. 14.
Figure 16:
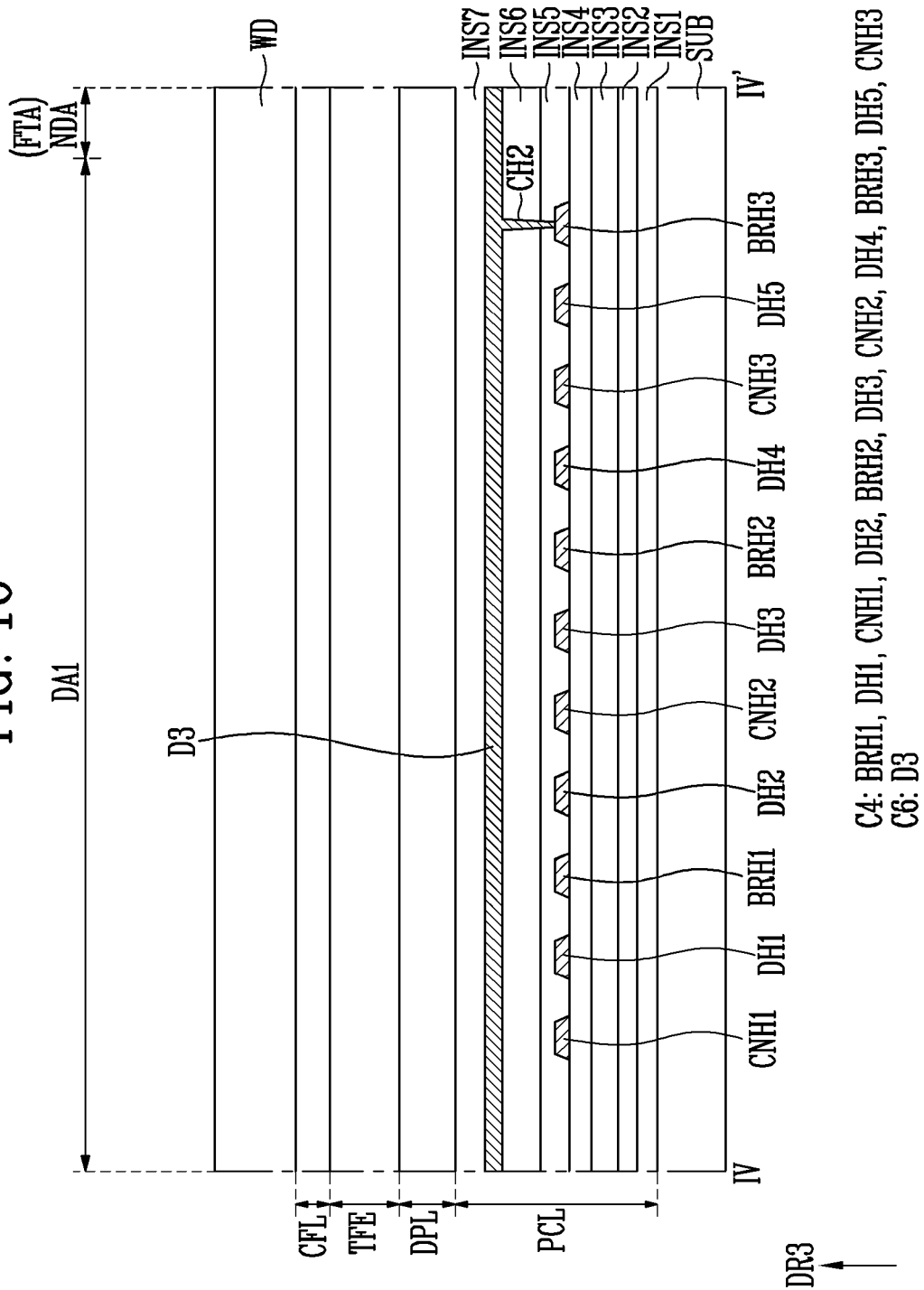
FIG. 16 is a schematic cross-sectional view taken along line IV-IV' shown in FIG. 14.

FIG. 14 is a schematic plan view illustrating a modification of FIG. 8. FIG. 15 is a schematic cross-sectional view taken along line III-III' shown in FIG. 14. FIG. 16 is a schematic cross-sectional view taken along line IV-IV' shown in FIG. 14.

In relation to embodiments shown in FIGS. 14 to 16, portions different from those of the above-described embodiment will be mainly described to avoid redundancy.

Referring to FIGS. 1 to 16, a dummy line DML may be disposed between the connection line CNL and the bridge line BRL. The dummy line DML may be disposed to be spaced apart from each of the connection line CNL and the bridge line BRL. The dummy line DML, the connection line CNL, and the bridge line BRL may not overlap with each other.

The dummy line DML may include first, second, third, fourth, and fifth dummy lines DML1, DML2, DLM3, DML4, and DML5. In an embodiment, a DC voltage having a constant level may be applied to each of the first, second, third, fourth, and fifth dummy lines DML1, DML2, DLM3, DML4, and DML5. For example, the reset voltage (see "VRST" shown in FIG. 4) may be applied to each of the first, second, third, fourth, and fifth dummy lines DML1, DML2, DLM3, DML4, and DML5, but the present disclosure is not limited thereto. In some embodiments, one of the first initialization power voltage (see "Vint1" shown in FIG. 4), the second initialization power voltage (see "Vint2" shown in FIG. 4), and the first power voltage (see "VDD" shown in FIG. 4), which are described with reference to FIG. 4, may be applied to each of the first, second, third, fourth, and fifth dummy lines DML1, DML2, DLM3, DML4, and DML5. Although not directly shown in the drawings, the dummy line DML may be electrically connected to a power driver disposed in the pad area PDA to be supplied with the reset voltage VRST from the power driver.

The first dummy line DML1 may include a first horizontal dummy line DH1, a 1ath vertical dummy line DV1a (or first vertical dummy line), and a 1bth vertical dummy line DV1b (or second vertical dummy line).

The first horizontal dummy line DH1 may extend along the first direction DR1, and be disposed while traversing the second area DA2 from the first area DA1 or traversing the first area DA1 from the second area DA2. One end of the first horizontal dummy line DH1 may be electrically connected to the 1ath vertical dummy line DV1a through a fifth contact hole CH5 in the first area DA1. The other end of the first horizontal dummy line DH1 may be electrically connected to the 1bth vertical dummy line DV1b through a sixth contact hole CH6 in the second area DA2. The one end of the first horizontal dummy line DH1 may be located in the first area DA1, and the other end of the first horizontal dummy line DH1 may be located in the second area DA2.

In a plan view, the first horizontal dummy line DH1 may be disposed between the first horizontal connection line CNH1 and the first horizontal bridge line BRH1. The first horizontal dummy line DH1 to which the reset voltage VRST as the DC voltage having the constant level is applied may be located between the first horizontal connection line CNH1 and the first horizontal bridge line BRH1, which are adjacent to each other in the second direction DR2, thereby preventing a crosstalk phenomenon in which a sensing signal applied to the first horizontal connection line CNH1 is changed when a data signal applied to the first horizontal bridge line BRH1 is changed. In other words, the first horizontal dummy line DH1 may be used as a shielding member for reducing and preventing a coupling cap occurring between the first horizontal connection line CNH1 and the first horizontal bridge line BRH1. The first horizontal dummy line DH1, the first horizontal bridge line BRH1, and the first horizontal connection line CNH1 may be disposed in the same layer. For example, the first horizontal dummy line DH1, the first horizontal bridge line BRH1, and the first horizontal connection line CNH1 may be configured as the fourth conductive layer C4 disposed on the fourth insulating layer INS4, but the present disclosure is not limited thereto.

The 1ath vertical dummy line DV1a may extend along the second direction DR2, and be disposed in the first area DA1. The 1ath vertical dummy line DV1a may be electrically connected to the one end of the first horizontal dummy line DH1 through the fifth contact hole CH5. The 1ath vertical dummy line DV1a may be disposed to be spaced apart from the first vertical connection line CNV1 and the first data line D1, which are adjacent to each other in the first direction DR1. The 1ath vertical dummy line DV1a may be located between the first vertical connection line CNV1 and the first data line D1, which are adjacent to each other in the first direction DR1, thereby preventing or reducing a coupling cap occurring between the first vertical connection line CNV1 and the first data line D1.

The 1ath vertical dummy line DV1a, the first data line D1, and the first vertical connection line CNV1 may be disposed in the same layer. For example, the 1ath vertical dummy line DV1a, the first data line D1, and the first vertical connection line CNV1 may be configured as the sixth conductive layer C6 disposed on the sixth insulating layer INS6, but the present disclosure is not limited thereto.

The 1bth vertical dummy line DV1b may extend along the second direction DR2, and be disposed in the second area DA2. The 1bth vertical dummy line DV1b may be electrically connected to the other end of the first horizontal dummy line DH1 through the sixth contact hole CH6. The 1bth vertical dummy line DV1b may be disposed to be spaced apart from the sixth data line D6 and the seventh readout line RX7, which are adjacent to each other in the first direction DR1. The 1bth vertical dummy line DV1b may be located between the sixth data line D6 and the seventh readout line RX7, which are adjacent to each other in the first direction DR1, thereby reducing or preventing a coupling cap which may occur between the sixth data line D6 and the seventh readout line RX7. The 1bth vertical dummy line DV1b, the sixth data line D6, and the seventh readout line RX7 may be configured as the sixth conductive layer C6, but the present disclosure is not limited thereto.

The second dummy line DML2 may include a second horizontal dummy line DH2, a 2ath vertical dummy line DV2a (or first vertical dummy line), and a 2bth vertical dummy line DV2b (or second vertical dummy line).

The second horizontal dummy line DH2 may extend along the first direction DR1, and be disposed while traversing the second area DA2 from the first area DA1 or traversing the first area DA1 from the second area DA2. One end of the second horizontal dummy line DH2 may be electrically connected to the 2ath vertical dummy line DV2a through a fifth contact hole CH5 in the first area DA1. The other end of the second horizontal dummy line DH2 may be electrically connected to the 2bth vertical dummy line DV2b through a sixth contact hole CH6 in the second area DA2. The one end of the second horizontal dummy line DH2 may be located in the first area DA1, and the other end of the second horizontal dummy line DH2 may be located in the second area DA2.

In a plan view, the second horizontal dummy line DH2 may be disposed between the first horizontal bridge line BRH1 and the second horizontal connection line CNH2. The second horizontal dummy line DH2 may be disposed between the first horizontal bridge line BRH1 and the second horizontal connection line CNH2, which are adjacent to each other in the second direction DR2 to reduce or prevent a coupling cap which may occur between the first horizontal bridge line BRH1 and the second horizontal connection line CNH2. The second horizontal dummy line DH2, the first horizontal bridge line BRH1, and the second horizontal connection line CNH2 may include the same material, and be disposed in the same layer. For example, the second horizontal dummy line DH2, the first horizontal bridge line BRH1, and the second horizontal connection line CNH2 may be configured as the fourth conductive layer C4, but the present disclosure is not limited thereto.

The 2ath vertical dummy line DV2a may extend along the second direction DR2, and be disposed in the first area DA1. The 2ath vertical dummy line DV2a may be electrically connected to the one end of the second horizontal dummy line DH2 through the fifth contact hole CH5. The 2ath vertical dummy line DV2a may be located between the first data line D1 and the second readout line RX2, and be disposed to be spaced apart from each of the first data line D1 and the second readout line RX2 in the first direction DR1. In an embodiment, the 2ath vertical dummy line DV2a may be disposed between the first data line D1 and the second readout line RX2, which are adjacent to each other in the first direction DR1 to reduce or prevent a coupling cap which may occur between the first data line D1 and the second readout line RX2. The 2ath vertical dummy line DV2a, the first data line D1, and the second readout line RX2 may include the same material, and be disposed in the same layer. For example, the 2ath vertical dummy line DV2a, the first data line D1, and the second readout line RX2 may be configured as the sixth conductive layer C6, but the present disclosure is not limited thereto.

The 2bth vertical dummy line DV2b may extend along the second direction DR2, and be disposed in the second area DA2. The 2bth vertical dummy line DV2b may be electrically connected to the other end of the second horizontal dummy line DH2 through the sixth contact hole CH6. The 2bth vertical dummy line DV2b may be disposed to be spaced apart from the sixth readout line RX6 and the first vertical bridge line BRV1, which are adjacent to each other in the first direction DR1. In an embodiment, the 2bth vertical dummy line DV2b may be disposed between the sixth readout line RX6 and the first vertical bridge line BRV1, which are adjacent to each other in the first direction DR1 to reduce or prevent a coupling cap which may occur between the sixth readout line RX6 and the first vertical bridge line BRV1. The 2bth vertical dummy line DV2b, the sixth readout line RX6, and the first vertical bridge line BRV1 may be configured as the sixth conductive layer C6.

The third dummy line DML3 may include a third horizontal dummy line DH3, a 3ath vertical dummy line DV3a (or first vertical dummy line), and a 3bth vertical dummy line DV3b (or second vertical dummy line).

The third horizontal dummy line DH3 may extend along the first direction DR1, and be disposed while traversing the second area DA2 from the first area DA1 or traversing the first area DA1 from the second area DA2. One end of the third horizontal dummy line DH3 may be electrically connected to the 3ath vertical dummy line DV3a through a fifth contact hole CH5 in the first area DA1. The other end of the third horizontal dummy line DH3 may be electrically connected to the 3bth vertical dummy line DV3b through a sixth contact hole CH6 in the second area DA2. The one end of the third horizontal dummy line DH3 may be located in the first area DA1, and the other end of the third horizontal dummy line DH3 may be located in the second area DA2.

In a plan view, the third horizontal dummy line DH3 may be disposed between the second horizontal connection line CNH2 and the second horizontal bridge line BRH2. The third horizontal dummy line DH3 may be disposed between the second horizontal connection line CNH2 and the second horizontal bridge line BRH2, which are adjacent to each other in the second direction DR2 to reduce or prevent a coupling cap which may occur between the second horizontal connection line CNH2 and the second horizontal bridge line BRH2. The third horizontal dummy line DH3, the second horizontal connection line CNH2, and the second horizontal bridge line BRH2 may include the same material, and be disposed in the same layer. For example, the third horizontal dummy line DH3, the second horizontal connection line CNH2, and the second horizontal bridge line BRH2 may be configured as the fourth conductive layer C4, but the present disclosure is not limited thereto.

The 3ath vertical dummy line DV3a may extend along the second direction DR2, and be disposed in the first area DA1. The 3ath vertical dummy line DV3a may be electrically connected to the one end of the third horizontal dummy line DH3 through the fifth contact hole CH5. The 3ath vertical dummy line DV3a may be disposed to be spaced apart from the second data line D2 and the second vertical connection line CNV2 in the first direction DR1. The 3ath vertical dummy line DV3a may be located between the second data line D2 and the second vertical connection line CNV2, thereby reducing or prevent a coupling cap which may occur between the second data line D2 and the second vertical connection line CNV2. The 3ath vertical dummy line DV3a, the second data line D2, and the second vertical connection line CNV2 may include the same material, and be disposed in the same layer. For example, the 3ath vertical dummy line DV3a, the second data line D2, and the second vertical connection line CNV2 may be configured as the sixth conductive layer C6, but the present disclosure is not limited thereto.

The 3bth vertical dummy line DV3b may extend along the second direction DR2, and be disposed in the second area DA2. The 3bth vertical dummy line DV3b may be electrically connected to the other end of the third horizontal dummy line DH3 through the sixth contact hole CH6. The 3bth vertical dummy line DV3b may be located between the fifth data line D5 and the sixth readout line RX6, and be disposed to be spaced apart from each of the fifth data line D5 and the sixth readout line RX6 in the first direction DR1. The 3bth vertical dummy line DV3b may be disposed between the fifth data line D5 and the sixth readout line RX6, which are adjacent to each other in the first direction DR1 to reduce or prevent a coupling cap which may occur between the fifth data line D5 and the sixth readout line RX6. The 3bth vertical dummy line DV3b, the fifth data line D5, and the sixth readout line RX6 may include the same material, and be disposed in the same layer. For example, the 3bth vertical dummy line DV3b, the fifth data line D5, and the sixth readout line RX6 may be configured as the sixth conductive layer C6, but the present disclosure is not limited thereto.

The fourth dummy line DML4 may include a fourth horizontal dummy line DH4, a 4ath vertical dummy line DV4a (or first vertical dummy line), and a 4bth vertical dummy line DV4b (or second vertical dummy line).

The fourth horizontal dummy line DH4 may extend along the first direction DR1, and be disposed while traversing the second area DA2 from the first area DA1 or traversing the first area DA1 from the second area DA2. One end of the fourth horizontal dummy line DH4 may be electrically connected to the 4ath vertical dummy line DV4a through a fifth contact hole CH5 in the first area DA1. The other end of the fourth horizontal dummy line DH4 may be electrically connected to the 4bth vertical dummy line DV4b through a sixth contact hole CH6 in the second area DA2. The one end of the fourth horizontal dummy line DH4 may be located in the first area DA1, and the other end of the fourth horizontal dummy line DH4 may be located in the second area DA2.

In a plan view, the fourth horizontal dummy line DH4 may be disposed between the second horizontal bridge line BRH2 and the third horizontal connection line CNH3. The fourth horizontal dummy line DH4 may be disposed between the second horizontal bridge line BRH2 and the third horizontal connection line CNH3, which are adjacent to each other in the second direction DR2 to reduce or prevent a coupling cap which may occur between the second horizontal bridge line BRH2 and the third horizontal connection line CNH3. The fourth horizontal dummy line DH4, the second horizontal bridge line BRH2, and the third horizontal connection line CNH3 may include the same material, and be disposed in the same layer. For example, the fourth horizontal dummy line DH4, the second horizontal bridge line BRH2, and the third horizontal connection line CNH3 may be configured as the fourth conductive layer C4, but the present disclosure is not limited thereto.

The 4ath vertical dummy line DV4a may extend along the second direction DR2, and be disposed in the first area DA1. The 4ath vertical dummy line DV4a may be electrically connected to the one end of the fourth horizontal dummy line DH4 through the fifth contact hole CH5. The 4ath vertical dummy line DV4a may be located between the second data line D2 and the third readout line RX3, and be disposed to be spaced apart from each of the second data line D2 and the third readout line RX3 in the first direction DR1. The 4ath vertical dummy line DV4a may be disposed between the second data line D2 and the third readout line RX3, which are adjacent to each other in the first direction DR1 to reduce or prevent a coupling cap which may occur between the second data line D2 and the third readout line RX3. The 4ath vertical dummy line DV4a, the second data line D2, and the third readout line RX3 may include the same material, and be disposed in the same layer. For example, the 4ath vertical dummy line DV4a, the second data line D2, and the third readout line RX3 may be configured as the sixth conductive layer C6, but the present disclosure is not limited thereto.

The 4bth vertical dummy line DV4b may extend along the second direction DR2, and be disposed in the second area DA2. The 4bth vertical dummy line DV4b may be electrically connected to the other end of the fourth horizontal dummy line DH4 through the sixth contact hole CH6. The 4bth vertical dummy line DV4b may be located between the second vertical bridge line BRV2 and the fifth readout line RX5, which are adjacent to each other in the first direction DR1, thereby reducing or preventing a coupling cap occurring between the second vertical bridge line BRV2 and the fifth readout line RX5. The 4bth vertical dummy line DV4b, the second vertical bridge line BRV2, and the fifth readout line RX5 may include the same material, and be disposed in the same layer. For example, the 4bth vertical dummy line DV4b, the second vertical bridge line BRV2, and the fifth readout line RX5 may be configured as the sixth conductive layer C6, but the present disclosure is not limited thereto.

The fifth dummy line DML5 may include a fifth horizontal dummy line DH5, a 5ath vertical dummy line DV5a (or first vertical dummy line), and a 5bth vertical dummy line DV5b (or second vertical dummy line).

The fifth horizontal dummy line DH5 may extend along the first direction DR1, and be disposed while traversing the second area DA2 from the first area DA1 or traversing the first area DA1 from the second area DA2. One end of the fifth horizontal dummy line DH5 may be electrically connected to the 5ath vertical dummy line DV5a through a fifth contact hole CH5 in the first area DA1. The other end of the fifth horizontal dummy line DH5 may be electrically connected to the 5bth vertical dummy line DV5b through a sixth contact hole CH6 in the second area DA2. The one end of the fifth horizontal dummy line DH5 may be located in the first area DA1, and the other end of the fifth horizontal dummy line DH5 may be located in the second area DA2.

In a plan view, the fifth horizontal dummy line DH5 may be disposed between the third horizontal connection line CNH3 and the third horizontal bridge line BRH3. The fifth horizontal dummy line DH5 may be disposed between the third horizontal connection line CNH3 and the third horizontal bridge line BRH3, which are adjacent to each other in the second direction DR2 to reduce or prevent a coupling cap which may occur between the third horizontal connection line CNH3 and the third horizontal bridge line BRH3. The fifth horizontal dummy line DH5, the third horizontal bridge line BRH3, and the third horizontal connection line CNH3 may include the same material, and be disposed in the same layer. For example, the fifth horizontal dummy line DH5, the third horizontal bridge line BRH3, and the third horizontal connection line CNH3 may be configured as the fourth conductive layer C4, but the present disclosure is not limited thereto.

The 5ath vertical dummy line DV5a may extend along the second direction DR2, and be disposed in the first area DA1. The 5ath vertical dummy line DV5a may be electrically connected to the one end of the fifth horizontal dummy line DH5 through the fifth contact hole CH5. The 5ath vertical dummy line DV5a may be located between the third data line D3 and the third vertical connection line CNV3, which are adjacent to each other in the first direction DR3 to reduce or prevent a coupling cap which may occur between the third data line D3 and the third vertical connection line CNV3. The 5ath vertical dummy line DV5a, the third data line D3, and the third vertical connection line CNV3 may include the same material, and be disposed in the same layer. For example, the 5ath vertical dummy line DV5a, the third data line D3, and the third vertical connection line CNV3 may be configured as the sixth conductive layer C6, but the present disclosure is not limited thereto.

The 5bth vertical dummy line DV5b may extend along the second direction DR2, and be disposed in the second area DA2. The 5bth vertical dummy line DV5b may be electrically connected to the other end of the fifth horizontal dummy line DH5 through the sixth contact hole CH6. The 5bth vertical dummy line DV5b may be located between the fourth data line D4 and the fifth readout line RX5, which are adjacent to each other in the first direction DR1 to reduce or prevent a coupling cap which may occur between the fourth data line D4 and the fifth readout line RX5. The 5bth vertical dummy line DV5b, the fourth data line D4 and the fifth readout line RX5 may include the same material, and be disposed in the same layer. For example, the 5bth vertical dummy line DV5b, the fourth data line D4 and the fifth readout line RX5 may be configured as the sixth conductive layer C6, but the present disclosure is not limited thereto.

In an embodiment, a horizontal connection line, a horizontal dummy line, and a horizontal bridge line may include the same material, and be disposed in the same layer. For example, the first to third horizontal connection lines CNH1, CNH2, and CNH3, the first to fifth horizontal dummy lines DH1, DH2, DH3, DH4, and DH5, and the first to third horizontal bridge lines BRH1, BRH2, and BRH3 may be configured as the fourth conductive layer C4 disposed on the fourth insulating layer INS4. However, the present disclosure is not limited thereto. In some embodiments, the horizontal connection line and the horizontal bridge line may be disposed in the same layer, and the horizontal dummy line may be disposed in a layer different from the layer in which the horizontal connection line and the horizontal bridge line are disposed.

In an embodiment, a vertical connection line, a vertical dummy line, and a vertical bridge line may include the same material, and be disposed in the same layer. For example, the first to third vertical connection lines CNV1, CNV2, and CNV3, the 1ath to 5ath vertical dummy lines DV1a, DV2a, DV3a, DV4a, and DV5a, the 1bth to 5bth vertical dummy lines DV1*b*, DV2*b*, DV3*b*, DV4*b*, and DV5*b*, and the first to third vertical bridge lines BRV1, BRV2, and BRV3 may be configured as the sixth conductive layer C6 disposed on the sixth insulating layer INS6.

In accordance with the above-described embodiment, a dummy line DML to which the reset voltage VRST having a constant level is applied is disposed between a connection line CNL electrically connected to a readout line and a bridge line BRL electrically connected to a data line, thereby reducing or preventing a coupling cap which may occur between the connection line CNL (or the readout line) and the bridge line BRL (or the data line). Accordingly, the reliability of the display device DD can be further improved.

Figure 17:
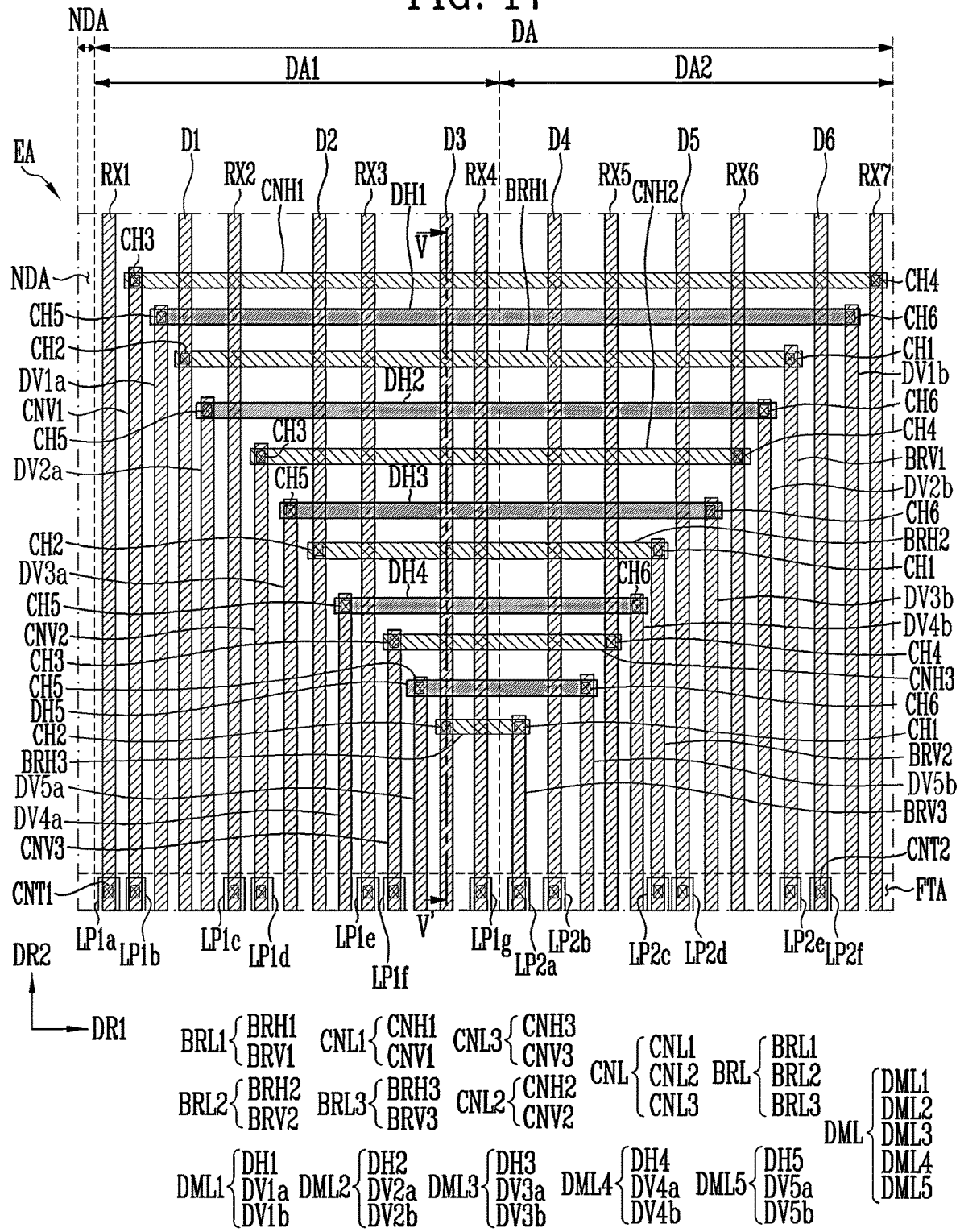
FIG. 17 is a schematic plan view illustrating a modification of FIG. 14.
Figure 18:
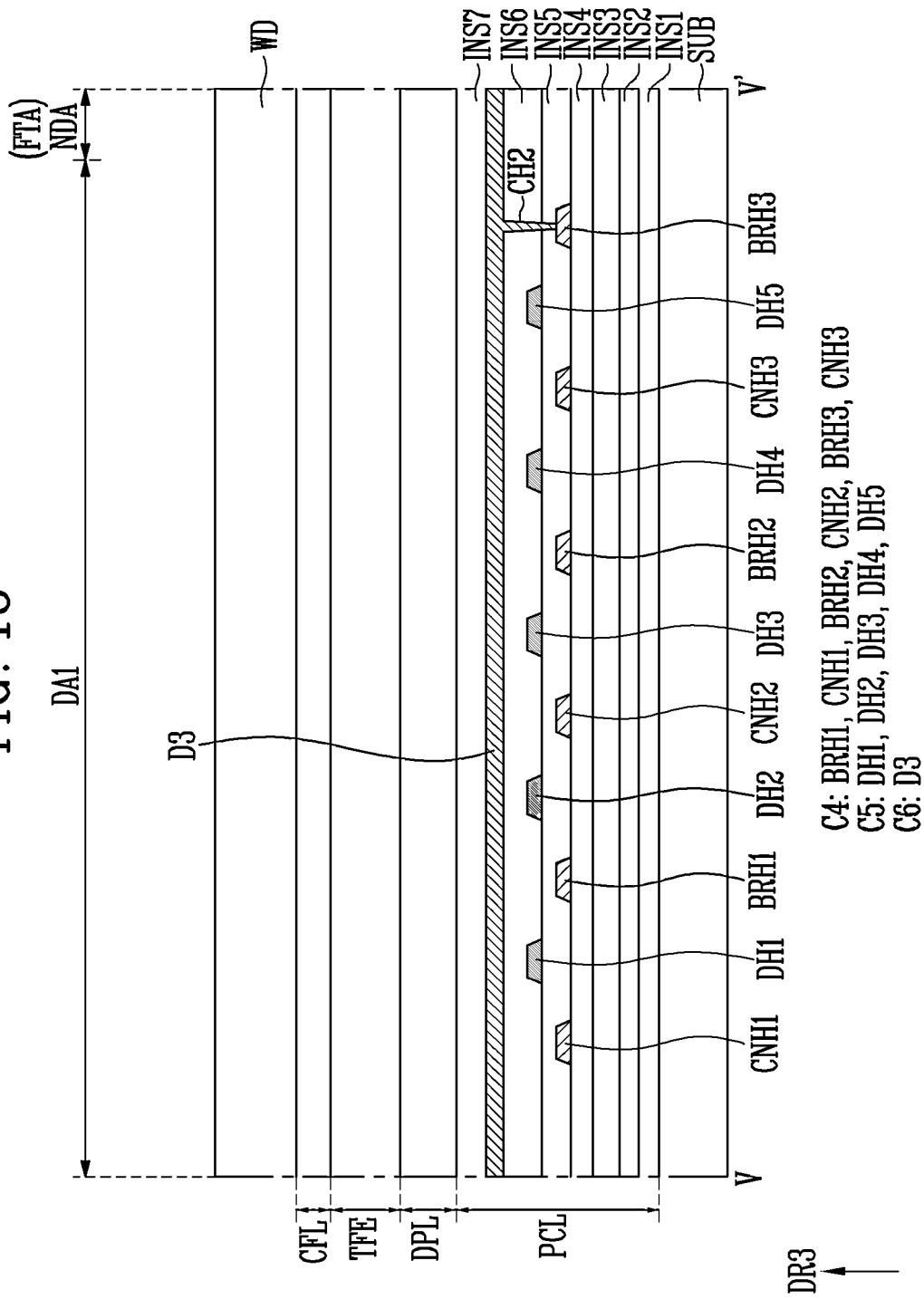
FIG. 18 is a schematic cross-sectional view taken along line V-V' shown in FIG. 17.

FIG. 17 is a schematic plan view illustrating a modification of FIG. 14. FIG. 18 is a schematic cross-sectional view taken along line V-V' shown in FIG. 17.

In relation to embodiments shown in FIGS. 17 and 18, portions different from those of the above-described embodiment will be mainly described to avoid redundancy.

Referring to FIGS. 1 to 7, 17, and 18, each of the first, second, third, fourth, and fifth horizontal dummy lines DH1, DH2, DH3, DH4, and DH5 may be disposed in a layer different from a layer in which lines adjacent to each other in the second direction DR2 are disposed. For example, the first horizontal dummy line DH1 may be disposed in a layer different from a layer in which each of the first horizontal connection line CNH1 and the first horizontal bridge line BRH1 is disposed. The second horizontal dummy line DH2 may be disposed in a layer different from a layer in which each of the first horizontal bridge line BRH1 and the second horizontal connection line CNH2 is disposed. The third horizontal dummy line DH3 may be disposed in a layer different from a layer in which each of the second horizontal connection line CNH2 and the second horizontal bridge line BRL2 is disposed. The fourth horizontal dummy line DH4 may be disposed in a layer different from a layer in which each of the second horizontal bridge line BRH2 and the third horizontal connection line CNH3 is disposed. The fifth horizontal dummy line DH5 may be disposed in a layer different from a layer in which each of the third horizontal connection layer CNH3 and the third horizontal bridge line BRH3 is disposed.

In an embodiment, the first horizontal connection line CNH1, the first horizontal bridge line BRH1, the second horizontal connection line CNH2, the second horizontal bridge line BRH2, the third horizontal connection line CNH3, and the third horizontal bridge line BRH3 may be configured as the fourth conductive layer C4 disposed on the fourth insulating layer INS4. The first horizontal dummy line DH1, the second horizontal dummy line DH2, the third horizontal dummy line DH3, the fourth horizontal dummy line DH4, and the fifth horizontal dummy line DH5 may be configured as the fifth conductive layer C5 disposed on the fifth insulating layer INS5.

In the above-described embodiment, it is illustrated that each of a first line (see "LP1" shown in FIG. 1) and a first pad part (see "PDP1" shown in FIG. 7), which are electrically connected to a readout line, is located in an edge (or outside) in the non-display area NDA, and each of a second line (see "LP2" shown in FIG. 1) and a second pad part (see "PDP2" shown in FIG. 7), which are electrically connected to a data line is located in a middle (or inside) in the non-display area NDA. However, the present disclosure is not limited thereto. In some embodiments, each of the second line LP2 and the second pad part PDP2, which are electrically connected to the data line, may be located in an edge (or outside) in the non-display area NDA, and each of the first line LP1 and the first pad part PDP1, which are electrically connected to the readout line, may be located in a middle (or inside) in the non-display area NDA. This will be described with reference to FIG. 19.

Figure 19:
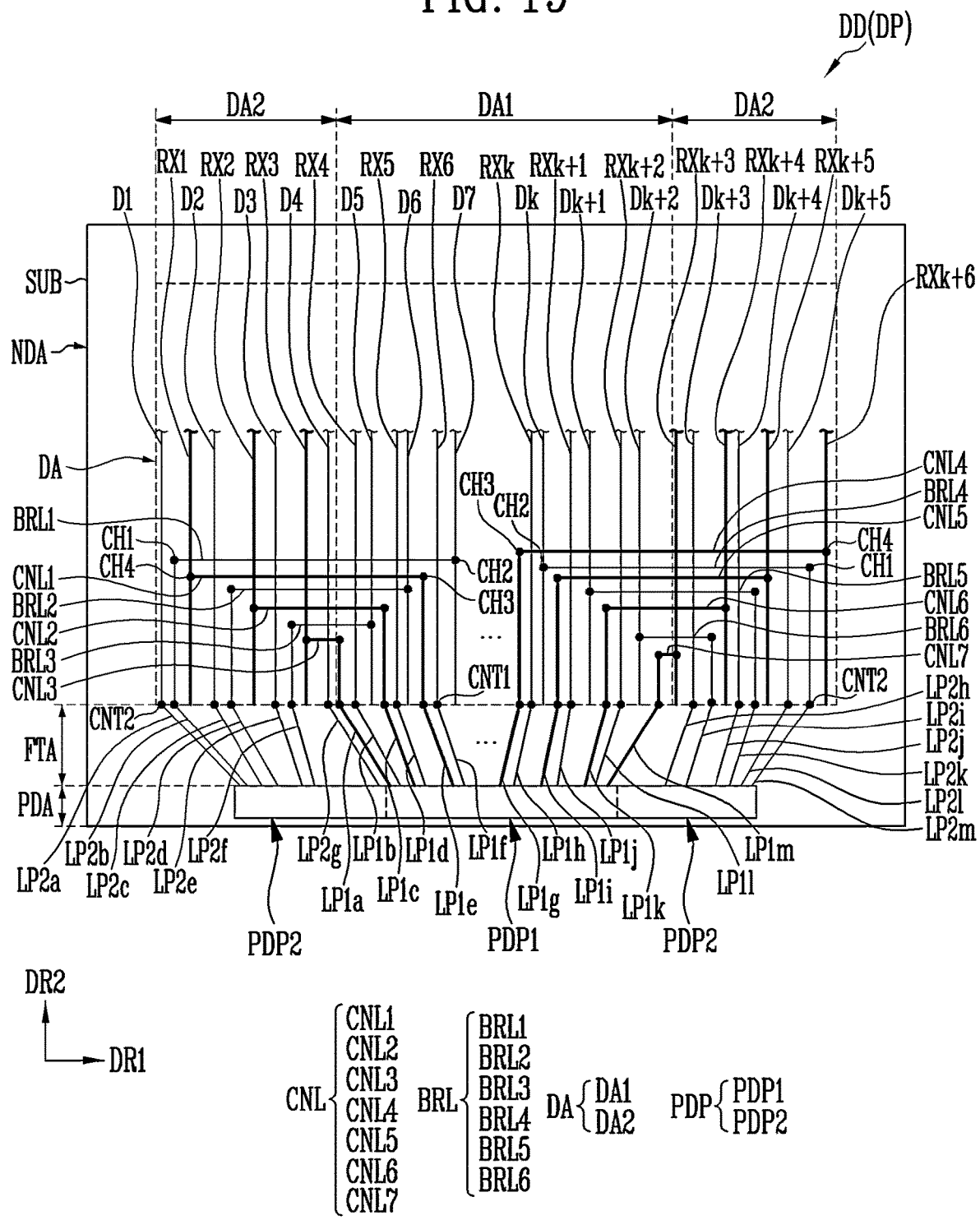
FIG. 19 is a schematic plan view illustrating a modification of FIG. 7.

FIG. 19 is a schematic plan view illustrating a modification of FIG. 7.

In relation to an embodiment shown in FIG. 19, portions different from those of the above-described embodiment will be mainly described to avoid redundancy.

Referring to FIG. 19, the display device DD (or the display panel DP) may include a substrate SUB, a line part, and a pad part PDP.

The pad part PDP may include a first pad part PDP1 and a second pad part PDP2 which are located in a pad area PDA. The first pad part PDP1 and the second pad part PDP2 may be disposed while being spaced apart from each other to be physically and electrically separated from each other in the pad area PDA. For example, the second pad part PDP2 may be located adjacent to an edge of the substrate SUB in the pad area PDA, and the first pad part PDP1 may be located in the middle in the pad area PDA.

The substrate SUB may include a display area DA and a non-display area NDA. The display area DA may include a first area DA1 and a second area DA2. The first area DA1 may be one area of the display area DA which corresponds to first lines, and the second area DA2 may be one area of the display area DA which corresponds to second lines. The first area DA1 may be located in the middle in the display area DA, and the second area DA2 may be located at an edge of the display area DA disposed adjacent to the non-display area NDA. For example, the second area DA2 may be located at both edges of the first area DA1 located in the middle of the display area DA.

The line part may include first lines electrically connected to a readout line disposed in the first area DA1 through a first contact part CNT1 and second lines electrically connected to a data line disposed in the second area DA2 through a second contact part CNT2. The first lines may include 1ath to 1mth lines LP1*a* to LP1*m*, and the second lines may include 2ath to 2mth lines LP2*a* to LP2*m*.

Some of the 1ath to 1mth lines LP1*a* to LP1*m* may be electrically connected to a readout line, e.g., fourth, fifth, sixth, kth, (k+1)th, and (k+2)th readout lines RX4, RX5, RX6, RXk, RXk+1, and RXk+2, located in the first area DA1 through a first contact part CNT1. For example, 1bth, 1dth, 1fth, 1hth, 1jth, and 11th lines LP1*b*, LP1*d*, LP1*f*, LP1*h*, LP1*j*, and LP1*l* among the 1ath to 1mth lines LP1*a* to LP1*m* may be electrically connected to the readout lines located in the first area DA1.

The others of the 1ath to 1mth lines LP1*a* to LP1*m* may be electrically connected to a connection line CNL through a first contact part CNT1. For example, 1ath, 1cth, 1eth, 1gth, 1ith, 1kth, and 1mth lines LP1*a*, LP1*c*, LP1*e*, LP1*g*, LP1*i*, LP1*k*, and LP1*m* among the 1ath to 1mth lines LP1*a* to LP1*m* may be electrically connected to the connection line CNL through the first contact part CNT1.

The 1ath to 1mth lines LP1*a* to LP1*m* may be disposed in one area of a fan-out area FTA which corresponds to the first area DA1. For example, the 1ath to 1mth lines LP1*a* to LP1*m* may be located in the middle in the fan-out area FTA.

Some of the 2ath to 2mth lines LP2*a* to LP2*m* may be electrically connected to a data line, e.g., first, second, third, fourth, (k+3)th, (k+4)th, and (k+5)th data lines D1, D2, D3, D4, Dk+3, Dk+4, and Dk+5, located in the second area DA2, through a second contact part CNT2. For example, 2ath, 2cth, 2eth, 2gth, 2hth, 2jth, and 21th lines LP2*a*, LP2*c*, LP2*e*, LP2*g*, LP2*h*, LP2*j*, and LP21 among the 2ath to 2mth lines LP2*a* to LP2*m* may be electrically connected to the data line located in the second area DA2.

The others of the 2a*th* to 2m*th* lines LP2*a* to LP2*m* may be electrically connected to a bridge line BRL through a second contact part CNT2. For example, 2b*th*, 2d*th*, 2f*th*, 2i*th*, 2k*th*, and 2m*th* lines LP2*b*, LP2*d*, LP2*f*, LP2*i*, LP2*k*, and LP2*m* among the 2a*th* to 2m*th* lines LP2*a* to LP2*m* may be electrically connected to the bridge line BRL through the second contact part CNT2.

The 2a*th* to 2m*th* lines LP2*a* to LP2*m* may be disposed one area of the fan-out area FTA which corresponds to the second area DA2. For example, the 2a*th* to 2m*th* lines LP2*a* to LP2*m* may be located at an edge of the fan-out area FTA.

The 2a*th* to 2m*th* lines LP2*a* to LP2*m* may be disposed at both sides of the 1a*th* to 1m*th* lines LP1*a* to LP1*m*. For example, 2a*th* to 2g*th* lines LP2*a* to LP2*g* may be located adjacent to the 1a*th* line LP1*a*, and 2h*th* to 2m*th* lines LP2*h* to LP2*m* may be located adjacent to the 1m*th* line LP1*m*.

The connection line CNL may extend from the first area DA1 to the second area DA2. For example, the connection line CNL may be disposed across a border between the first area DA1 and the second area DA2 and extend from a middle (or inside) of the display area DA to an edge of the display area DA. The connection line CNL may be electrically connected to a corresponding first line through a first contact part CNT1. The connection line CNL may include a vertical connection line which is disposed in the first area DA1 and extends in the second direction DR2 and a horizontal connection line which extend along the first direction and is located while traverse the second area DA2 from the first area DA1.

The connection lien CNL may include a first connection line CNL1, a second connection line CNL2, a third connection line CNL3, a fourth connection line CNL4, a fifth connection line CNL5, a sixth connection line CNL6, and a seventh connection line CNL7. Each of the first, second, third, fourth, fifth, sixth, and seventh connection lines CNL1, CNL2, CNL3, CNL4, CNL5, CNL6, and CNL7 may include a vertical connection line which is located in the first area DA1 and extends in the second direction DR2 and a horizontal connection line which extends in the first direction DR1 and is located while traversing the second area DA2 from the first area DA1.

For example, a vertical connection line of the seventh connection line CNL7 among the first, second, third, fourth, fifth, sixth, and seventh connection lines CNL1, CNL2, CNL3, CNL4, CNL5, CNL6, and CNL7 may be located in the first area DA1, and be electrically connected to the 1m*th* line LP1*m* through a first contact part CNT1. The vertical connection line may be electrically connected to a horizontal connection line of the seventh connection line CNL7 through a third contact hole CH3. The horizontal connection line may be electrically connected to the (k+3)th readout line RXk+3 disposed in the second area DA2 through a fourth contact hole CH4. Accordingly, a sensing signal form a photo sensing pixel (see "PSR" shown in FIG. 1) of the second area DA2, which is received to the (k+3)th readout line RXk+3, may be transferred to a driver (see "DIC" shown in FIG. 2) via the 1m*th* line LP1*m* through the seventh connection line CNL7.

The bridge line BRL may extend from the second area DA2 to the first area DA1. For example, the bridge line BRL may be disposed across a border between the first area DA1 and the second area DA2 and extend from an edge of the display area DA to a middle (or inside) of the display area DA. The bridge line BRL may include a vertical bridge line which is disposed in the second area DA2 and extends in the second direction DR2 and a horizontal bridge line which extend along the first direction DR1 and traversing the first area DA1 from the second area DA2.

The bridge line BRL may include a first bridge line BRL1, a second bridge line BRL2, a third bridge line BRL3, a fourth bridge line BRL4, a fifth bridge line BRL5, and a sixth bridge line BRL6. Each of the first, second, third, fourth, fifth, and sixth bridge lines BRL1, BRL2, BRL3, BRL4, BRL5, and BRL6 may include a vertical bridge line which is located in the second area DA2 and extends in the second direction DR2 and a horizontal bridge line which extends in the first direction DR1 and traversing the first area DA1 from the second area DA2.

For example, a vertical bridge line of the first bridge line BRL1 among the first, second, third, fourth, fifth, and sixth bridge lines BRL1, BRL2, BRL3, BRL4, BRL5, and BRL6 may be located in the second area DA2, and be electrically connected to the 2b*th* line LP2*b* through a second contact part CNT2. The vertical bridge line may be electrically connected to a horizontal bridge line of the first bridge line BRL1 through a first contact hole CH1. The horizontal bridge line may be electrically connected to a seventh data line D7 disposed in the first area DA1 through a second contact hole CH2. Accordingly, a data signal transferred to the 2b*th* line LP2*b* from the driver DIC may be transferred to the seventh data line D7 via the first bridge line BRL1.

In an embodiment, the first to seventh connection lines CNL1 to CNL7 and the first to sixth bridge lines BRL1 to BRL6 may be disposed in the display area DA not to overlap with each other.

In accordance with the above-described embodiment, the first pad part PDP1 electrically connected to a readout line and the second pad part PDP2 electrically connected to a data line may be separated from each other in the pad area PDA to be disposed while being spaced apart from each other. For example, the first pad part PDP1 may be located in the middle of the pad area PDA to correspond to the first area DA1 of the display area DA without any intervening second pad, and the second pad part PDP2 may be located at both edges of the pad area PDA to correspond to the second area DA2 of the display area DA without any intervening first pad. Interference between a sensing signal of the photo sensing pixel PSR which is transferred to the driver DIC through the first pad part PDP1 and a data signal transferred to the data line via the second pad part PDP2 may be reduced or prevented. Interference between a data signal transferred to the data line via the second pad part PDP2 and a sensing signal of the photo sensing pixel PSR which is transferred to the driver DIC through the first pad part PDP1 may be reduced or prevented.

In accordance with the above-described embodiment, the 1a*th* to 1m*th* lines LP1*a* to LP1*m* electrically connected to a read out line and the 2a*th* to 2m*th* lines LP2*a* to LP2*m* electrically connected to a data line may be separated from each other in the fan-out area FTA to be disposed while being spaced apart from each other. For example, the 2a*th* to 2m*th* lines LP2*a* to LP2*m* may be located at both edges of the fan-out area FTA to correspond to the second area DA2 of the display area DA without any intervening first line, and the 1a*th* to 1m*th* lines LP1*a* to LP1*m* may be located in the middle of the fan-out area FTA to correspond to the first area DA1 of the display area DA without any intervening second line. Interference between a sensing signal of the photo sensing pixel PSR which is transferred to the first pad part PDP1 through each of the 1a*th* to 1m*th* lines LP1*a* to LP1*m* and a data signal transferred to the data line through each of the 2a*th* to 2m*th* lines LP2*a* to LP2*m* may be reduced or prevented. Also, interference between a data signal transferred to the data line through each of the 2ath to 2mth lines LP2a to LP2m and a sensing signal of the photo sensing pixel PSR which is transferred to the first pad part PDP1 through each of the 1ath to 1mth lines LP1a to LP1m may be reduced or prevented.

Figure 20:
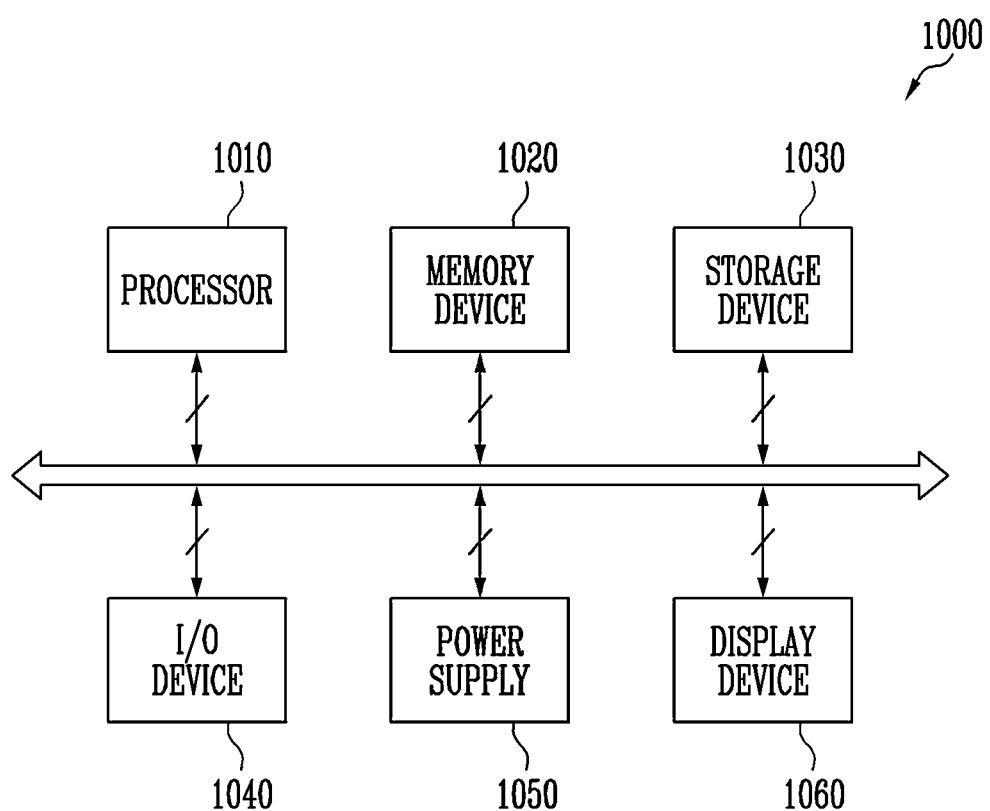
FIG. 20 is a schematic block diagram illustrating an electronic device in accordance with an embodiment of the present disclosure.
Figure 21:
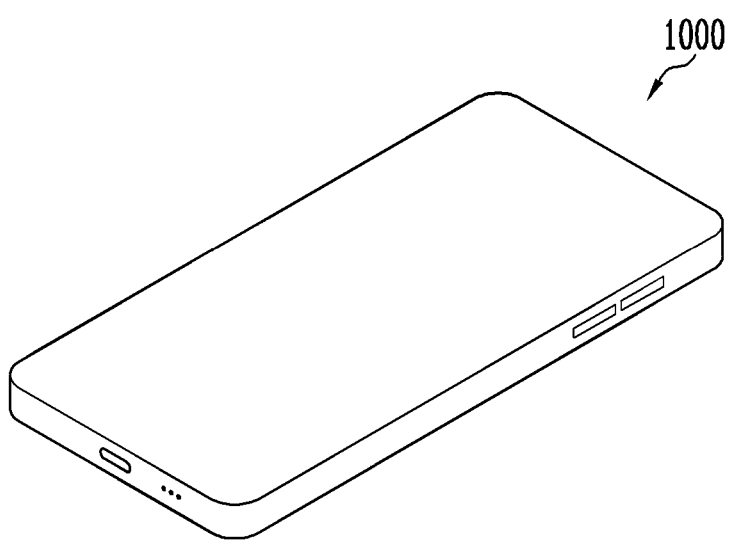
FIG. 21 is a schematic view illustrating an example in which the electronic device shown in FIG. 20 is implemented as a smartphone.
Figure 22:
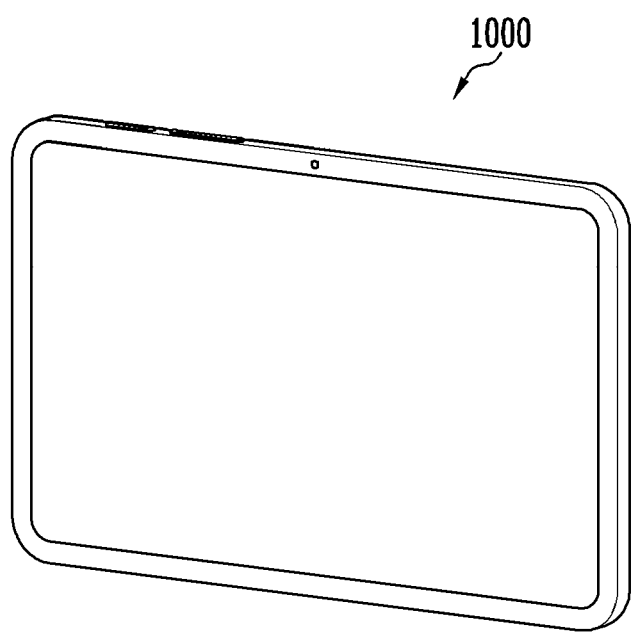
FIG. 22 is a schematic view illustrating an example in which the electronic device shown in FIG. 20 is implemented as a tablet PC.

FIG. 20 is a schematic block diagram illustrating an electronic device 1000 in accordance with an embodiment of the present disclosure. FIG. 21 is a schematic view illustrating an example in which the electronic device 1000 shown in FIG. 20 is implemented as a smartphone. FIG. 22 is a schematic view illustrating an example in which the electronic device 1000 shown in FIG. 20 is implemented as a tablet PC.

Referring to FIGS. 20 to 22, the electronic device 1000 may include a processor 1010, a memory device 1020, a storage device 1030, an input/output (I/O) device 1040, a power supply, 1050, and a display device 1060. The display device 1060 may be the display device shown in FIGS. 1 and 7. Also, the electronic device 1000 may further include several ports capable of communicating with a video card, a sound card, a memory card, a USB device, and the like, or communicating with other systems. In an embodiment, as shown in FIG. 21, the electronic device 1000 may be implemented as a smartphone. In another embodiment, as shown in FIG. 22, the electronic device 1000 may be implemented as a tablet PC. However, this is merely illustrative, and the electronic device 1000 is not limited to the above-described example. For example, the electronic device 1000 may be implemented as a mobile phone, a video phone, a smart pad, a smart watch, a tablet PC, a vehicle navigation system, a computer monitor, a notebook computer, a head mounted display device, or the like.

The processor 1010 may perform specific calculations or tasks. In some embodiments, the processor 1010 may be a microprocessor, a central processing unit, an application processor, or the like. The processor 1010 may be connected to other components through an address bus, a control bus, a data bus, and the like. In some embodiments, the processor 1010 may be connected to an extension bus such as a peripheral component interconnect (PCI) bus.

The memory device 1020 may store data necessary for an operation of the electronic device 1000. For example, the memory device 1010 may include a nonvolatile memory device such as an Erasable Programmable Read-Only Memory (EPROM) device, an Electrically Erasable Programmable Read-Only Memory (EEPROM) device, a flash memory device, a Phase Change Random Access Memory (PRAM) device, a Resistance Random Access Memory (RRAM) device, a Nano Floating Gate Memory (NFGM) device, a Polymer Random Access Memory (PoRAM) device, a Magnetic Random Access Memory (MRAM) device, or a Ferroelectric Random Access Memory (FRAM) device, and/or a volatile memory device such as a Dynamic Random Access Memory (DRAM) device, a Static Random Access Memory (SRAM) device, or a mobile DRAM device.

The storage device 1030 may include a Solid State Drive (SSD), a Hard Disk Drive (HDD), a CD-ROM, and the like.

The I/O device 1040 may include an input means such as a keyboard, a keypad, a touch screen, or a mouse, and an output means such as a speaker or a printer. In some embodiments, the display device 1060 may be included in the I/O device 1040.

The power supply 1050 may supply power necessary for an operation of the electronic device 1000. For example, the power supply 1050 may be a power management integrated circuit (PMIC).

The display device 1060 may display an image corresponding to visual information of the electronic device 1000. The display device 1060 may be an organic light emitting display device or a quantum dot light emitting display device, but the present disclosure is not limited thereto. The display device 1060 may be connected to other components through the buses or another communication link.

In accordance with the present disclosure, there can be provided a display device in which a first line (or first fan-out line) electrically connected to a readout line and a second line (or second fan-out line) electrically connected to a data line are not disposed adjacent to each other but is disposed to be separated from each other in a non-display area, so that a parasitic capacitance which may be generate between the first line and the second line can be reduced, thereby improving the reliability of the display device.

In accordance with the present disclosure, there can be provided a display device in which a connection line electrically connected to a readout line and a bridge line electrically connected to a data line are designed not to overlap with each other in a display area, so that a parasitic capacitance which may be generate between the connection line and the bridge line can be reduced, thereby improving the reliability of the display device.

In accordance with the present disclosure, there can be provided a display device in which a dummy line to which a DC voltage having a constant level is applied is disposed between the connection line and the bridge line in a display area, so that a parasitic capacitance which may be generate between the connection line and the bridge line can be further reduced, thereby improving the reliability of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the scope of the present disclosure as set forth in the following claims.

What is claimed is:

1. A display device comprising:
    a substrate including a display area which includes a first area and a second area, and a non-display area;
    a plurality of data lines located in the first area and the second area;
    a plurality of readout lines located in the first area and the second area, the plurality of readout lines being spaced apart from the plurality of data lines, respectively;
    a plurality of connection lines extending from the first area to the second area, the plurality of connection lines being electrically connected to corresponding readout lines disposed in the second area; and a plurality of bridge lines extending from the second area to the first area, the plurality of bridge lines being electrically connected to corresponding data lines disposed in the first area, wherein the plurality of connection lines and the plurality of bridge lines do not overlap with each other, wherein the plurality of connection lines includes a plurality of horizontal connection lines extending from the first area to the second area along a first direction and a plurality of vertical connection lines which are located in the first area and extend in a second direction intersecting the first direction, and wherein the plurality of bridge lines includes a plurality of horizontal bridge lines extending from the second area to the first area along the first direction and a plurality of vertical bridge lines which are located in the second area and extend in the second direction.

2. The display device of claim 1, further comprising:

a plurality of first lines located in a fan-out area which is disposed in the non-display area, the plurality of first lines being electrically connected to the plurality of connection lines, respectively;

a plurality of second lines located in the fan-out area, the plurality of second lines being electrically connected to the plurality of bridge lines, respectively; and a pad part located in a pad area which is disposed in the non-display area, wherein the pad part includes a first pad part including a plurality of first pads electrically connected to the plurality of first lines, respectively, and a second pad part including a plurality of second pads electrically connected to the plurality of second lines, respectively, and wherein the plurality of first lines are disposed at both sides of the plurality of second lines, and the first pad part is disposed at both sides of the second pad part.

3. The display device of claim 2, wherein the plurality of readout lines disposed in the first area is directly connected to corresponding first pads, and wherein the plurality of data lines disposed in the second area is directly connected to corresponding second pads.

4. The display device of claim 1, further comprising:

a plurality of first lines located in a fan-out area which is disposed in the non-display area, the plurality of first lines being electrically connected to the plurality of connection lines, respectively;

a plurality of second lines located in the fan-out area, the plurality of second lines being electrically connected to the plurality of bridge lines, respectively; and a pad part located in a pad area which is disposed in the non-display area, wherein the pad part includes a first pad part electrically connected to the plurality of first lines and a second pad part electrically connected to the plurality of second lines, and wherein the plurality of second lines are disposed at both sides of the plurality of first lines, and the second pad part is disposed at both sides of the first pad part.

5. The display device of claim 1, wherein the plurality of vertical connection lines, the plurality of vertical bridge lines, the plurality of data lines, and the plurality of readout lines are disposed in the same layer.

6. The display device of claim 1, wherein the plurality of data lines disposed in the first area is electrically connected to the plurality of vertical bridge lines through the plurality of horizontal bridge lines, respectively, and wherein the plurality of readout lines disposed in the second area is electrically connected to the plurality of vertical connection lines through the plurality of horizontal connection lines, respectively.

7. The display device of claim 6, wherein an insulating layer is disposed between one ends of the plurality of horizontal bridge lines and the plurality of vertical bridge lines and between the other ends of the plurality of horizontal bridge lines and the plurality of data lines, and wherein the insulating layer is disposed between one ends of the plurality of horizontal connection lines and the plurality of vertical connection lines and between the other ends of the plurality of horizontal connection lines and the plurality of readout lines.

8. The display device of claim 7, wherein the one ends of the plurality of horizontal bridge lines are electrically connected to the plurality of vertical bridge lines through first contact holes formed through the insulating layer, and the other ends of the plurality of horizontal bridge lines are electrically connected to the plurality of data lines through second contact holes formed through the insulating layer, and wherein the one ends of the plurality of horizontal connection lines are electrically connected to the plurality of vertical connection lines through third contact holes formed through the insulating layer, and the other ends of the plurality of horizontal connection lines are electrically connected to the plurality of readout lines through fourth contact holes formed through the insulating layer.

9. The display device of claim 1, wherein, in the first area, the plurality of vertical connection lines, the plurality of readout lines, and the plurality of data lines are disposed to be spaced apart from each other, wherein, in the second area, the plurality of vertical bridge lines, the plurality of readout lines, and the plurality of data lines are disposed to be spaced apart from each other, and wherein the plurality of horizontal connection lines and the plurality of horizontal bridge lines are disposed to be spaced apart from each other.

10. The display device of claim 1, wherein the plurality of horizontal connection lines and the plurality of vertical connection lines are disposed in different layers, and wherein the plurality of horizontal bridge lines and the plurality of vertical bridge lines are disposed in different layers.

11. The display device of claim 1, wherein the plurality of horizontal connection lines and the plurality of horizontal bridge lines are disposed in the same layer, and wherein the plurality of vertical connection lines and the plurality of vertical bridge lines are disposed in the same layer.

12. The display device of claim 1, wherein the plurality of horizontal connection lines and the plurality of horizontal bridge lines are disposed in different layers.

13. The display device of claim 1, further comprising a dummy line disposed between the plurality of connection lines and the plurality of bridge lines in the display area, respectively, wherein a DC signal having a constant level is applied to the dummy line.

14. The display device of claim 13, wherein the dummy line includes:

a plurality of horizontal dummy lines extending from the first area to the second area along the first direction;

a plurality of first vertical dummy lines located in the first area, the plurality of first vertical dummy lines extending in the second direction; and a plurality of second vertical dummy lines located in the second area, the plurality of second vertical dummy lines extending in the second direction.

15. The display device of claim 14, wherein the plurality of horizontal dummy lines are disposed between the plurality of horizontal bridge lines and the plurality of horizontal connection lines, respectively, and wherein the plurality of vertical dummy lines are disposed between the plurality of vertical bridge lines and the plurality of vertical connection lines, respectively.

16. The display device of claim 15, wherein the plurality of horizontal dummy lines, the plurality of horizontal bridge lines, and the plurality of horizontal connection lines are disposed in the same layer, and wherein the plurality of vertical dummy lines, the plurality of vertical bridge lines, and the plurality of vertical connection lines are disposed in the same layer.

17. The display device of claim 15, wherein the plurality of vertical dummy lines, the plurality of vertical bridge lines, and the plurality of vertical connection lines are disposed in the same layer, and wherein the plurality of horizontal dummy lines are disposed in a layer different from a layer in which the plurality of horizontal bridge lines and the plurality of horizontal connection lines are disposed.

18. The display device of claim 1, further comprising a plurality of sub-pixels which are located in the display area and each includes a light emitting element emitting light and photo sensing pixels which are located in the display area and each including a light receiving element outputting a sensing signal corresponding to the light.

19. An electronic device comprising:

a processor configured to provide input image data to a display device; and the display device configured to display an image based on the input image data, wherein the display device includes:

a substrate including a display area which includes a first area and a second area, and a non-display area;

a plurality of data lines located in the first area and the second area;

a plurality of readout lines located in the first area and the second area, the plurality of readout lines being spaced apart from the plurality of data lines;

a plurality of connection lines extending from the first area to the second area, the plurality of connection lines being electrically connected to corresponding readout lines disposed in the second area;

a plurality of bridge lines extending from the second area to the first area, the plurality of bridge lines being electrically connected to corresponding data lines disposed in the first area; and a plurality of dummy lines disposed between the plurality of connection lines and the plurality of bridge lines in the display area, respectively, wherein a DC signal having a constant level is applied to the dummy line.

* * * * *